(12) United States Patent
Layton

(10) Patent No.: US 9,348,078 B2
(45) Date of Patent: May 24, 2016

(54) OPTICAL ANTENNAS WITH ENHANCED FIELDS AND ELECTRON EMISSION

(75) Inventor: Phillip J. Layton, San Diego, CA (US)

(73) Assignee: Pacific Integrated Energy, Inc., San Diego, CA (US)

( * ) Notice: Subject to any disclaimer, the term of this patent is extended or adjusted under 35 U.S.C. 154(b) by 502 days.

(21) Appl. No.: 13/702,303

(22) PCT Filed: Jun. 8, 2011

(86) PCT No.: PCT/US2011/039671
§ 371 (c)(1),
(2), (4) Date: Mar. 12, 2013

(87) PCT Pub. No.: WO2011/156519
PCT Pub. Date: Dec. 15, 2011

(65) Prior Publication Data
US 2013/0294729 A1    Nov. 7, 2013

Related U.S. Application Data

(60) Provisional application No. 61/352,697, filed on Jun. 8, 2010.

(51) Int. Cl.
| | | |
|---|---|---|
| G02B 6/00 | (2006.01) |
| H01L 31/054 | (2014.01) |
| B82Y 20/00 | (2011.01) |
| G02B 6/122 | (2006.01) |
| H01L 31/0352 | (2006.01) |
| H01Q 21/06 | (2006.01) |

(52) U.S. Cl.
CPC . *G02B 6/00* (2013.01); *B82Y 20/00* (2013.01); *G02B 6/1226* (2013.01); *H01L 31/035209* (2013.01); *H01L 31/0547* (2014.12); *H01Q 21/064* (2013.01); *Y02E 10/52* (2013.01)

(58) Field of Classification Search
None
See application file for complete search history.

(56) References Cited

U.S. PATENT DOCUMENTS

| | | |
|---|---|---|
| 3,994,012 A | 11/1976 | Warner, Jr. |
| 4,000,503 A | 12/1976 | Matare |

(Continued)

FOREIGN PATENT DOCUMENTS

| | | |
|---|---|---|
| CN | 1263603 A | 8/2000 |
| CN | 1930693 A | 3/2007 |

(Continued)

OTHER PUBLICATIONS

Castro, et al. Performance of Ag—Ti02 photocatalysts towards the photocatalytic disinfection of water under interior lighting and solar-simulated light irradiations. International Journal of Photoenergy. 2012. Article ID: 261045.

(Continued)

*Primary Examiner* — Mike Stahl
(74) *Attorney, Agent, or Firm* — Wilson Sonsini Goodrich & Rosati

(57) ABSTRACT

An electromagnetic energy collecting and sensing device is described. The device uses enhanced fields to emit electrons for energy collection. The device is configured to collect energy from visible light, infrared radiation and ultraviolet electromagnetic radiation. The device includes a waveguide with a geometry selected to enhance the electric field along a conductor to create a high, localized electric field, which causes electron emission across a gap to an electron return plane.

26 Claims, 13 Drawing Sheets

(56) References Cited

U.S. PATENT DOCUMENTS

| | | | |
|---|---|---|---|
| 4,191,593 A * | 3/1980 | Cacheux | 136/259 |
| 4,574,161 A | 3/1986 | Marks | |
| 4,720,642 A | 1/1988 | Marks | |
| 5,461,280 A | 10/1995 | Kane | |
| 5,973,259 A | 10/1999 | Edelson | |
| 5,991,000 A | 11/1999 | Shimabukuro et al. | |
| 6,020,677 A | 2/2000 | Blanchet-Fincher et al. | |
| 6,091,186 A | 7/2000 | Cao et al. | |
| 6,127,624 A | 10/2000 | Ishida et al. | |
| 6,136,543 A | 10/2000 | Anazawa et al. | |
| 6,180,415 B1 | 1/2001 | Schultz et al. | |
| 6,242,193 B1 | 6/2001 | Anazawa et al. | |
| 6,250,984 B1 | 6/2001 | Jin et al. | |
| 6,283,812 B1 | 9/2001 | Jin et al. | |
| 6,344,272 B1 | 2/2002 | Oldenburg et al. | |
| 6,512,235 B1 | 1/2003 | Eitan et al. | |
| 6,630,772 B1 | 10/2003 | Bower et al. | |
| 6,741,019 B1 | 5/2004 | Filas et al. | |
| 6,750,394 B2 | 6/2004 | Yamamoto et al. | |
| 6,946,785 B2 | 9/2005 | Ito et al. | |
| 7,064,474 B2 | 6/2006 | Liu et al. | |
| 7,102,157 B2 | 9/2006 | Kastalsky et al. | |
| 7,141,781 B2 | 11/2006 | Hagmann | |
| 7,151,268 B2 | 12/2006 | Fujieda et al. | |
| 7,157,848 B2 | 1/2007 | Tang et al. | |
| 7,176,478 B2 | 2/2007 | Kastalsky et al. | |
| 7,202,596 B2 | 4/2007 | Tang et al. | |
| 7,217,404 B2 | 5/2007 | Ajayan et al. | |
| 7,359,598 B2 | 4/2008 | Kim et al. | |
| 7,365,632 B2 | 4/2008 | Bertin et al. | |
| 7,408,147 B2 | 8/2008 | Blick et al. | |
| 7,476,787 B2 | 1/2009 | Thomas et al. | |
| 7,501,288 B2 | 3/2009 | Schultz et al. | |
| 7,569,188 B2 | 8/2009 | Stockman et al. | |
| 7,579,764 B2 | 8/2009 | Wei et al. | |
| 8,507,785 B2 | 8/2013 | Layton | |
| 8,969,710 B2 | 3/2015 | Layton | |
| 2001/0002315 A1 | 5/2001 | Schultz et al. | |
| 2004/0095050 A1 | 5/2004 | Liu et al. | |
| 2004/0155184 A1 | 8/2004 | Stockman et al. | |
| 2004/0181344 A1 | 9/2004 | Stephanopoulos et al. | |
| 2004/0212290 A1 | 10/2004 | Ito et al. | |
| 2004/0245910 A1 | 12/2004 | Tang et al. | |
| 2004/0245911 A1 | 12/2004 | Tang et al. | |
| 2005/0062973 A1 | 3/2005 | Kim et al. | |
| 2005/0161668 A1 | 7/2005 | Kastalsky et al. | |
| 2005/0247929 A1 | 11/2005 | Kastalsky et al. | |
| 2006/0192115 A1 | 8/2006 | Thomas et al. | |
| 2006/0210279 A1 | 9/2006 | Hillis et al. | |
| 2007/0023621 A1 | 2/2007 | Blick et al. | |
| 2007/0205723 A1 | 9/2007 | Sommerer et al. | |
| 2007/0210956 A1 | 9/2007 | Hillis et al. | |
| 2007/0236126 A1 | 10/2007 | Wei et al. | |
| 2007/0289623 A1 | 12/2007 | Atwater | |
| 2008/0002529 A1 | 1/2008 | Sekine et al. | |
| 2008/0115817 A1 | 5/2008 | Defries | |
| 2008/0143906 A1 | 6/2008 | Allemand et al. | |
| 2008/0218074 A1 | 9/2008 | Kastalsky | |
| 2008/0236652 A1 | 10/2008 | Defries et al. | |
| 2008/0258049 A1 | 10/2008 | Kuzmich et al. | |
| 2008/0271778 A1 | 11/2008 | Defries et al. | |
| 2009/0072161 A1 | 3/2009 | Ben-yakar et al. | |
| 2009/0117002 A1 | 5/2009 | Kotov et al. | |
| 2009/0117475 A1 | 5/2009 | Hyde et al. | |
| 2009/0128002 A1 | 5/2009 | Hu | |
| 2009/0130573 A1 | 5/2009 | Hyde et al. | |
| 2009/0161104 A1 | 6/2009 | Schultz et al. | |
| 2009/0203203 A1 | 8/2009 | Ernst et al. | |
| 2009/0218516 A1 | 9/2009 | Gryczynski et al. | |
| 2009/0223558 A1 * | 9/2009 | Sun et al. | 136/255 |
| 2009/0229648 A1 | 9/2009 | Makansi | |
| 2009/0236539 A1 | 9/2009 | Stockman et al. | |
| 2009/0260679 A1 * | 10/2009 | Sun et al. | 136/255 |
| 2009/0294692 A1 | 12/2009 | Bourke, Jr. et al. | |
| 2009/0303573 A1 | 12/2009 | Hillis et al. | |
| 2009/0308443 A1 | 12/2009 | Cutler | |
| 2009/0321626 A1 | 12/2009 | Vertes et al. | |
| 2010/0003316 A1 | 1/2010 | Vo Dinh et al. | |
| 2010/0012184 A1 | 1/2010 | Naya et al. | |
| 2010/0016783 A1 | 1/2010 | Bourke, Jr. et al. | |
| 2010/0073802 A1 | 3/2010 | Komura et al. | |
| 2010/0118390 A1 * | 5/2010 | Blair et al. | 359/346 |
| 2010/0175745 A1 | 7/2010 | Kostecki et al. | |
| 2010/0203454 A1 | 8/2010 | Brongersma et al. | |
| 2010/0206380 A1 * | 8/2010 | Lindquist et al. | 136/261 |
| 2010/0284086 A1 * | 11/2010 | Novack et al. | 359/580 |
| 2011/0220172 A1 * | 9/2011 | Layton | 136/246 |
| 2012/0012741 A1 * | 1/2012 | Vasylyev | 250/237 R |
| 2012/0032121 A1 | 2/2012 | Higashimura et al. | |
| 2013/0319514 A1 | 12/2013 | Layton | |
| 2014/0318596 A1 | 10/2014 | Juluri et al. | |
| 2014/0321805 A1 * | 10/2014 | Yosub et al. | 385/14 |

FOREIGN PATENT DOCUMENTS

| | | |
|---|---|---|
| EP | 1279705 A1 | 1/2003 |
| EP | 1279183 B1 | 3/2006 |
| EP | 979409 B1 | 12/2006 |
| EP | 1739724 A1 | 1/2007 |
| EP | 1830387 A2 | 9/2007 |
| EP | 2109147 A1 | 10/2009 |
| EP | 2112500 A1 | 10/2009 |
| EP | 1830387 A3 | 3/2011 |
| JP | 2006-259178 A | 9/2006 |
| JP | 2007/273832 A | 10/2007 |
| JP | 2007-303927 A | 11/2007 |
| JP | 2008-016294 A | 1/2008 |
| JP | 2008-196898 A | 8/2008 |
| JP | 2008-196992 A | 8/2008 |
| JP | 2008-233049 A | 10/2008 |
| JP | 2010/219399 A | 9/2010 |
| JP | 2011/171519 A | 9/2011 |
| WO | WO 89/10631 A1 | 11/1989 |
| WO | WO 98/13857 A1 | 4/1998 |
| WO | WO 98/21737 A1 | 5/1998 |
| WO | WO 98/37417 A1 | 8/1998 |
| WO | WO 01/84130 A2 | 11/2001 |
| WO | WO 01/84130 A3 | 6/2002 |
| WO | WO 03/042748 A1 | 5/2003 |
| WO | WO 2004/109738 A2 | 12/2004 |
| WO | WO 2004/113951 A2 | 12/2004 |
| WO | WO 2004/113951 A3 | 3/2005 |
| WO | WO 2004/109738 A3 | 5/2005 |
| WO | WO 2006/032950 A2 | 3/2006 |
| WO | WO 2006/032950 A3 | 10/2006 |
| WO | WO 2006/128181 A2 | 11/2006 |
| WO | WO 2007/003316 A1 | 1/2007 |
| WO | WO 2007/016113 A2 | 2/2007 |
| WO | WO 2006/128181 A3 | 5/2007 |
| WO | WO 2008/118234 A2 | 10/2008 |
| WO | WO 2007/016113 A3 | 12/2008 |
| WO | WO 2009/048695 A2 | 4/2009 |
| WO | WO 2009/105662 A1 | 8/2009 |
| WO | WO 2009/114567 A1 | 9/2009 |
| WO | WO 2009/124189 A1 | 10/2009 |
| WO | WO 2009/124970 A2 | 10/2009 |
| WO | WO 2009/130646 A1 | 10/2009 |
| WO | WO 2008/118234 A9 | 11/2009 |
| WO | WO 2009/048695 A3 | 12/2009 |
| WO | WO 2010/009106 A1 | 1/2010 |
| WO | WO 2010/117075 A1 | 10/2010 |

OTHER PUBLICATIONS

International search report and written opinion dated Aug. 22, 2014 for PCT/US2014/033877.

Yang, et al. Effects of surface resonance state on the plasmon resonance absorption of Ag nanoparticles embedded in partially oxidized amorphous Si matrix. Applied Physics Letters. 2000; 76(12):1537-1539.

Zhou, et al. Surface plasmon resonance-mediated photocatalysis by noble metal-based composites under visible light. J. Mater. Chem. 2012; 22:21337-21354.

(56) References Cited

OTHER PUBLICATIONS

Atwater. The promise of plasmonics. Sci Am. Apr. 2007;296(4):56-63.

Bharadwaj, et al. Optical antennas. Advances in Optics and Photonics. 2009; 1:438-483.

Cowell, et al. Advancing MIM electronics: amorphous metal electrodes. Adv Mater. Jan. 4, 2011;23(1):74-8. doi: 10.1002/adma.201002678.

Dagenais, et al. Solar spectrum rectification using nano-antennas and tunneling diodes. Optoelectronic integrated circuits XII, Proceedings of SPIE. Feb. 12, 2010; vol. 7605.

Dionne, et al. Plasmon slot waveguides: Towards chip-scale propagation with subwavelength-scale localization.

Dombi, et al. Ultrafast monoenergetic elec-tron source by optical waveform control of surface plasmons. Opt Express. Mar. 3, 2008;16(5):2887-93.

International search report and written opinion dated Feb. 9, 2012 for PCT/US2011/039671.

Knight, et al. Photodetection with active optical antennas. Science. May 6, 2011;332(6030):702-4. doi: 10.1126/science.1203056.

Kotter, et al. Solar Nantenna Electromagnetic Collectors. Proc. ASME. 43208, ASME 2008 2nd International Conference on Energy Sustainability, vol. 2 409 (Jan. 1, 2008) doi: 10.1115/ES2008-54016.

Laan, et al. Low current mode of negative corona: mechanism of electron emission. J. Phys. D: Appl. Phys. 2003; 36:2667-2672.

Maier. Plasmonics: fundamentals and applications. Springer. ISBN 978-0387331508. 2007. Nanowires and Conical Tapers for high-confinement and focusing. Section 7.4-7.5:124-129.

Muhlschlegal. Optical antennas. Ph.D. Thesis. University of Basel/Germany. Feb. 2006.

Park, et al. Feed-Horn Antenna for Enhanced Uncooled Infrared Sensor Using Novel UV Lithography, Plastic Micromachining and Mesh Structure Bonding. Japanese Journal of Applied Physics. 2004; 43(6A):3320-3327.

Pendry, et al. Mimicking surface plasmons with structured surfaces. Science. Aug. 6, 2004;305(5685):847-8. Epub Jul. 8, 2004.

Repan, et al. Electric field modeling for point-plane gap. Institute of Experimental Physics and Technology, University of Tartu, Tahe Estonia Publication. 2002.

Stockman, et al. Attosecond nanoplasmonic-field microscope. Nature Photonics. 2007; 1:539-544.

U.S. Appl. No. 14/357,941, filed May 13, 2014, Juluri et al.

Collectors, Proceedings of ES2008, Energy Sustainability 2008, Aug. 10-14, 2008, ES2008-54016, Jacksonville, Florida, pp. 1-7.

Flexible nanoantenna arrays capture abundant solar energy. Idaho National Laboratory, website news release, (https://in !portal in!.gov/portal/server.pt?open=514&objID=1555&mode=2 &featurestory=DA_144483), Aug. 11, 2008, 2 pages as printed.

Hao, et al. "High performance optical absorber based on a plasmonic metamaterial," Applied Physics Letters, vol. 96, No. 25, p. 251104, 2010.

Harvesting the sun's energy with antennas. Idaho National Laboratory, website news article (https://inlportaLinl.gov/portal/serverpt?open=514 &objID=1269&mode=2 &featurestory=DA_101047), Copyright 2007, 3 pages as printed.

Hedayati, et al. Design of a perfect black absorber at visible frequencies using plasmonic metamaterials. Adv Mater. Dec. 1, 2011;23(45):5410-4. doi: 10.1002/adma.201102646. Epub Oct. 14, 2011.

International search report and written opinion dated Mar. 18, 2013 for PCT Application No. US2012/064872.

Lee, et al. Surface plasmon-driven hot electron flow probed with metal-semiconductor nanodiodes. Nano Left. Oct. 12, 2011;11(10):4251-5. Epub Sep. 20, 2011.

Lin, et al. Polarization-independent broad-band nearly perfect absorbers in the visible regime. Opt Express. Jan. 17, 2011;19(2):415-424.

Mayer, et al. Simulations of infrared and optical rectification by geometrically asymmetric metal-vacuum-metal junctions for applications in energy conversion devices. Nanotechnology. 2010; 21(14):145204-145211.

McFarland, et al. A photovoltaic device structure based on internal electron emission. Nature. Feb. 6, 2003;421(6923):616-8.

Notice of allowance dated Jun. 10, 2013 for U.S. Appl. No. 12/259,104.

Office action dated Feb. 21, 2013 for U.S. Appl. No. 12/259,104.

Office action dated Sep. 25, 2012 for U.S. Appl. No. 12/259,104.

Service, Robert F. Membrane Makes Plastic Precursor Deliver More Bag for the Buck. Science. 2008; 320(5883):1584. DOI: 10.1126/science.320.5883.1584a.

European search report and opinion dated May 26, 2015 for EP Application No. 12849624.

Notice of allowance dated Oct. 23, 2014 for U.S. Appl. No. 13/932,936.

Office action dated Dec. 21, 2015 for U.S. Appl. No. 14/357,941.

* cited by examiner

3A

3B

OPTICAL ANTENNAS WITH ENHANCED FIELDS AND ELECTRON EMISSION

CROSS-REFERENCE

This application claims priority to U.S. Provisional Patent Application Ser. No. 61/352,697, filed on Jun. 8, 2010, which is entirely incorporated herein by reference.

BACKGROUND OF THE INVENTION

Traditionally, ultraviolet (UV), visible and infrared electromagnetic or light energy is collected using semiconductors with bandgap energies tuned to the desired photon energy to be collected. Alternatively, light energy may be converted into thermal energy by an absorber and then the heat energy may be collected by traditional thermal energy collectors, such as sterling engines, steam engines or other methods. These major solar energy collection technologies may be further grouped as follows: 1) inorganic, semiconductor based photovoltaic ("PV") generation, 2) organic based PV generation, 3) nanotechnology, which includes carbon nanotubes and quantum dots, and 4) solar thermal or solar concentrator technologies. Silicon (semiconductor-based) PV technologies, solar thermal technologies and solar concentrator technologies are the most widely used currently commercially available and mature technologies.

In some cases, photovoltaic technologies use discrete bandgap potentials generated by p-doped and n-doped semiconductor material to collect energy from light. Typical inorganic PV efficiencies may range from 10% for the single junction cells up to around 28% for triple junction PV cells. PV technology is limited physically to less than 33% energy collection efficiency by bandgap energy collection limitations and by semiconductor electrical resistance.

Additionally semiconductor-based PV has high costs associated with the materials used and the manufacturing process. The material costs include the high cost to produce pure wafers and the use of rare and expensive materials. The manufacturing costs include the huge capital cost to build a semiconductor facility, the control of toxic materials used and the cleanliness requirement to prevent any impurities from doping the product while under manufacture. These costs may be reasonable for integrated circuit (IC) electronics because most, if not all features required to permit the IC to function may be located in a small area, with many devices being produced on a single wafer.

In contrast to the needs for IC electronics, solar collection technology requires large surface areas to collect light. The large area requirement provides an inherent limitation to devices that use expensive processes because of the surface area cost to generate PV-based solar energy. Therefore, there are cost restrictions for the use of inorganic PVs for many energy markets.

Another major downside for current PV technology is the use of toxic materials during processing of PV devices and in the final PV product. After the end of life of current PV devices, the environmentally toxic or hazardous materials contained in such devices creates an environmental disposal problem.

Another category of technology that may be used to collect photon energy includes sensors that use voltage enhanced field emission. Such devices use high voltages to detect typically low-intensity photons using the photoelectric effect. Such devices have a net energy loss and amplify a signal using an external power source. These devices consume more power than they produce and are not useful as energy collectors.

Another category of technology is based on a recent finding that electric field enhancement on existing detectors may improve the performance of photo-detectors. This method of enhancement uses surface structures to enhance the electric field in desired locations. The enhanced electric fields created in accordance with this category of technology allow greater electron mobility in devices.

Although conventional antennas convert electrical current from (to) antenna structures to (from) far-field, optical antennas may also be used for near-field applications such as imaging and touchscreen displays by contact sensors. Antenna structures may be designed using rigid or flexible substrate, metallic, and dielectric layers to give more integration flexibility and enable electromagnetic field manipulation through leveraging the geometrical shape of the optical antenna arrays at the macro-scale. Such combination of micro-geometrical structure at the unit cell level and macro-geometrical feature at the array level provide more degrees of freedom in defining the virtual values of the effective permittivity and permeability of the array. For instance, using inner layers of metamaterial structures with dispersive properties within the light spectrum to improve the optical antenna efficiencies and enable manipulation of the electromagnetic absorption and refraction at the air and inner interfaces. Furthermore, optical antennas may perform such conversion with and without 1) thermal conversion, 2) using plasmon frequencies of metal, or 3) leveraging quantum properties of material used to build such structures.

As promising as these new technologies are, most are restricted to collecting light using discrete quantum energy bands, which imposes the same inherent efficiency limitations as semiconductor PV technologies. Increasing the number of junctions or wells increases the number of bandgaps and increases the useable energy, which results in increased efficiency across the visible light spectrum. As with inorganic semiconductors, this approach has a downside because each new well or junction creates a layer that may interfere with (mask) the well or junction below it and increase the path length of both the light and the free charge, which increases the losses from absorption and electrical resistance. Furthermore, nanotechnology and quantum dots still have issues with toxicity, with the ability to manufacture and with efficiency.

The underlying structures of these optical antennas may be manufactured more economically and with high-yield allowing these small and simple structures to be used in various applications where size, cost, efficiency or precision is relevant.

SUMMARY OF THE INVENTION

Systems and methods disclosed herein are related to optical antennas that produce energy from incident electromagnetic waves using a field concentrating method to create an electron emission from a distressed field source. Such optical antennas are based on nanostructures formed using conductive and dielectric layers to capture light and convert it to energy using either current or voltage, or emit light from applied current (voltage) or highly distressed electromagnetic fields.

In some embodiments, the electromagnetic (EM) fields of light are locally enhanced by physical features of a photon collector and conversion design. In an embodiment, using the electromagnetic wave nature of light, the electric and the magnetic fields of the light wave are enhanced using structural geometries and layering between conductor and insulator or dielectric layers. In another embodiment, metal-coated nanospherical particles create collective coupling of electrons to an incident electromagnetic wave. In some cases, the size of the particle and the metal determine the characteristics of this coupling, which is also called a plasmon wave. In another embodiment, plasmon waves create a strong local field enhancement.

In some embodiments, field enhancement is created using a waveguide with optical antenna functionalities with and without leveraging plasmons. Incident light is trapped in the structures in the form of waveguides resonating over a broad range of frequency range, enabling more light to be captured and converted to electrical current through the high concentration of fields on part of the structure, hence improving overall efficiency. Plasmons occur at the interface of a metal and a dielectric. Under the right circumstances, light waves induces resonant interactions between the waves and the mobile electrons at the surface of the metal. Depending on the optical antenna structure, these resonances span a broad range of frequency ranges associated with the nature of waveguides trapped in the structure or through excitation of higher order modes. The interactions generate surface plasmons. Therefore using selective geometries on the surface metals induces frequency dependent resonant absorption.

System and methods described in some embodiments improve the collection efficiency of electromagnetic radiation in general and more specifically the collection efficiency of visible light. In some instances, this effect if achieved by 1) removing the quantum bandgap restrictions and utilizing a spectrum of electromagnetic radiation (e.g., for visible wavelengths, utilizing the entire visible and near visible spectrum, and/or 2) lowering the resistance of free electrons by improving the matching between the antenna structure and adjacent elements responsible for collecting the induced electrical current. There is a direct connection between the distressed field, field concentrate, and enhanced fields with conventional antenna parameter such as matching, radiation fields, directivity, efficiency, and so forth. Additionally, in certain instances, the systems and methods described herein do not require or do not comprise semiconductor materials. In some instances, the absence of semiconductor materials results in devices that are significantly less expensive than traditional semiconductor-based photovoltaics. In some potential applications, semiconductor is the preferable choice.

In some embodiments, systems and methods described herein collect electromagnetic energy using enhanced fields to create electron emission. In some cases, systems and methods described herein use feature sizes on the scale of the incident electromagnetic wave to generate localized field enhancements in conductors to capture the energy from the electromagnetic spectrum. In other words, the feature sizes, structural features, material used, and/or geometries (e.g., widths, lengths, diameters, shapes, depths, descending angles, or the like of a recessed structure; the distances between recessed structures; shapes or connectivity of anodes; or the like) of a system or method described herein are adjustable in order to improve overall energy collection, tune a system to improve the manner and efficiency in which energy is collected from a certain wavelength of light, and matching to enable efficient conversion to electrical current, or the like.

In some embodiments, the electric field is captured in a conductor with the geometry of the device creating a region of high field strength. The strength of the field is sufficient to cause electron emission across a gap to a ground plane or through an interface to the electrical current ports, creating a potential difference and a current. In some embodiments, a system or method described herein is utilized to collect UV, visible and/or infrared light. For example, the specific feature sizes and geometries provide a system wherein the entire spectrum of ultraviolet (UV), visible, and/or infrared (IR) light is captured using a single geometry.

System and methods provided herein are applicable in various settings, including, for example, solar energy collection, sensors, near-field imaging, touch-screen, cloaking, concentrated electromagnetic energy collection and optical to electrical signal conversion. As another example, systems and methods provided herein are used for applications that require electric power or for other electromagnetic sensor and system applications.

In an aspect, a field-enhancing energy collection device or system comprises:
  a substrate,
  the substrate comprising a base surface,
  the base surface comprising at least one recessed structure having one or more angled wall surfaces that taper downward away from the base surface, between which angled wall surfaces is formed a recess void,
  the recess void being empty or filled with a transparent or translucent material,
  the one or more angled wall surfaces coming into contact or close proximity at a distance from the base surface,
  the one or more angled surfaces comprising an electromagnetic energy conducting waveguide material,
  the electromagnetic energy conducting waveguide material being in optically exposed to the recess void, and
  an anode, wherein the device comprises a gap between the anode and the electromagnetic energy conducting waveguide material of the recessed structure.

In some embodiments, the electromagnetic collecting region of the device comprises an array of optical antenna structures and waveguides (e.g., within a recessed structure) across a plane (e.g., a base surface). In certain embodiments, the recessed structure(s), optical antenna structures, waveguides, anodes, or other portions of a system or device described herein are tailored to the electromagnetic spectrum to be collected. Preferably, the recessed structure comprises, and the waveguide is present on the surface of or optically exposed to the surface of (i.e., light may reach it), one or more sloping or tapered structures, such as conical structures, pyramidal or other polygon structured that is angled or tapered. Such optical antennas are similar to radiofrequency ("RF") horn antennas with the exception that they operating at light frequencies where conductors and insulators potentially behave differently. In some embodiments, the angle between the base surface and the interior wall surface of the recessed structure (see $\Theta$ in FIG. 3A) is about 90°, or between about 70° and 85°, or between about 54° and 70°, or less than 90°, or the like. In some instances, the size of the top down to the bottom (depth) of the recessed determines or influences (at least in part) the wavelengths of light that will be collected. In some instances, the top surface further incorporates curved or slanted edges to further improve the trapping of light in the structure. In some instances, the bottom surface further incorporates curved or slanted edges to further improve the field intensity at the electron emission level and matching condition with the electrical circuit interface. In some instances, these structures provide for or facilitate the collection of a spectrum of electromagnetic energy collection. Generally, these structures form the cathode or electron emitter for systems and devices described herein.

Additionally, in some instances, the spacing between two or more of these structures (providing for a base surface dimension of at least two recessed structures—see 311 in FIG. 3A) creates resonance regions for other wavelengths. In other words, in certain instances the sloping structures collect one spectrum of wavelengths and the distance between them collect another, thus providing for or facilitating the collection of multiple wavelengths. In some cases, the optical antenna structure at the unit cell level differs from one point to another in the array enabling higher manipulation of electromagnetic field absorption and propagation at the air or inner layer interfaces.

An additional embodiment includes a tube structure (e.g., wherein $\Theta$ is 90°). In some cases, the tube structure is circular, ellipsoidal or a polygonal in shape. Instead of a tapered structure, this option has one width or a limited number of widths for ellipsoidal or polygonal shape. In certain instances, such a structure provides a device or system that suitable for collecting energy from specific wavelengths. In certain instances, an array of such structures (e.g., having a plurality of different base surface dimensions and/or geometries) with set distances also provides additional specific wavelengths to be collected. In some embodiments, such systems are useful as sensors or in energy collection devices wherein energy from specific types/wavelengths of light are collected. In certain instances, varying the width of an array of these devices allows collecting wavelength-specific information by determining the signal strength from each device that has a particular size. As such a device such as this is optionally utilized in a specific frequency detector.

In certain embodiments, the collecting structure (recessed structure) is conical with a circular cross section; however, in other embodiments the collecting structure has other shapes, such as, for example, a square, ellipsoidal a pentagon, polygon or even parabolic. In some instances, the tapered cross section of the collecting structure creates nodes for each wavelength to be collected at multiple locations along the surface. In some instances, the collecting structure further incorporates curved, spiraling or slanted edges to further improve the field intensity at the electron emission level and matching condition with the electrical circuit interface. In some instances, a configuration packs many structures closely together such that a substantial portion of a collecting surface is covered by cones. In certain applications, tapered polygon structures such as hexagons are more advantageous for increasing the packing density. Additional embodiments include nonuniform regions to change the resonance areas or to create nodes to enhance particular frequencies over others.

In some embodiments the structures are tracks that are triangular or parabolic. In some instances, the device is manufactured with concentric or spiraling circles, squares or other structures. This enables the device to have several isolated regions that could limit the effects of damage or could also ease manufacturing the device. In some instances, the embodiments of the structure into a device are clustered to bypass the ones with bad cells. In general, the fabrication process provides that no cells are shorted during manufacturing; however some may present an open circuit.

For the preferred broad spectrum energy collection embodiment, the structures are inverted such that the base of the structure is at the top and the structure tapers downwardly. The base at the top faces the source of solar or other light energy. In some instances, the top base diameter (or other cross-sectional dimension, i.e., base surface dimension of a recessed structure) is on the order of the longest wavelength of collected light, which comprises the infrared (IR) portion, visible portion and the ultraviolet (UV) portion of the electromagnetic spectrum. For the visible portion, the waveguide base (or base surface dimensions) is, in one embodiment, between about 1000 nanometers (nm) and 600 nm, or about 800 nm and 750 nm. The dimensions are shorter for ultraviolet light. In some embodiments, for infrared collection, the base is larger or greater than 1 micron. In certain instances, this increase in size at the base above 1 micron will decrease the collection efficiency of the visible light since a greater amount of the area is dedicated to infrared light. As such the desired range of frequencies to be collected need to be considered when choosing the waveguide collection dimensions.

In certain instances, sloping geometry, similar to horn antennas, creates an environment where a range of wavelengths of the incident spectrum have a trap region with a respective diameter or width in the waveguide structure corresponding to each wavelength of light. In some cases, this trapping is further enhanced by incorporating slanted or cylindrical surfaces at the top or bottom surfaces, or by including grooves or some sort of surface roughness along the inner surface of the sloping geometry, or by including metamaterial resonating structures or metal-insulator-metal ("MIM") layer along the inner side.

In some instances, waveguide structure comprises a conductor (e.g., an electromagnetic energy conducting material) with a thickness determined by the desired collection properties. In certain embodiments, the thickness is on the order of the wavelength of electromagnetic skin depth in the conducting medium. In specific embodiments, conductors useable for the walls of the waveguides include metals such as gold, silver, copper and aluminum. In other embodiments, other non-metallic materials are also used. For example, graphene has particular relativistic quantum electrodynamic properties that create a very low-resistance light trap. In suitable instances, any material that creates a plasmon wave at the conducting surface interface will work to varying degrees depending on the incident wavelength and the desired collection spectrum. In some embodiments, the conducting (or waveguide) layer is supported by either a dielectric such as $SiO_2$ or some other easily manufactured material such as plastic or another nonconducting medium.

In one optional mode, multiple conductors, multiple metal layers, Metal-Insulator-Metal (MIM) layers, or metamaterial-based layers are used to modify the plasmon wave generated at the interface between the different material layers, further enhance trapping light with MIM layers, or enable electron quantum tunneling along the MIM layers. In suitable instances, standing waves in the metal coupled with a plasmon wave at the dielectric/metal or bimetal interface create the high field region at the tip of each waveguide structure. The plasmon wave at the conducting material interfaces creates a waveguide along the cone for shorter wavelength light that has not yet reached the region of the cone that matches its wavelength. In certain instances, the enhanced field at the tip structure of the waveguide structure creates a localized high field area where electrons are emitted across a gap. In suitable instances, the gap is tailored to the device based on the dielectric strength of the gap and the required operating voltage of the device. In specific embodiments, of a configuration for visible light, the gap distance is less than the shortest wavelength of light to be collected, however in some instances a gap distance greater than this will also work. This waveguide tip creates a cathode for the field emitter.

In suitable instances, the enhanced field causes electrons from the conducting cathode to jump across the gap to the anode or ground plane when proper matching is reached at the electron collection interface. In some embodiments, the electron current is a function of the intensity of light, geometry and materials of the waveguide, the dielectric material, the distance between the two conductors, any voltage across the cathode anode gap and the enhanced field at the point. In certain embodiments, the voltage is a function of the field strength and the dielectric material or vacuum gap.

In suitable instances, a ground plane, or anode collects the emitted electrons. The ground plane is connected to a load with appropriate matching conditions. In some embodiments, the load is advantageously a motor, a battery, a storage device or any other device that uses or collects the electrical energy generated by the energy collector disclosed herein or sense current intensity in the case of sensors or touchscreen applications. In one embodiment the anode has an inverted tapered structure pointing up towards the cathode, the cathode being the electron emitting tip of the conical structure. This creates a higher field disturbance between the cathode and anode, lowering the required field for emission.

In certain embodiments of the systems and methods, the cathode and anode are connected to a voltage source that changes the field between the cathode and anode. In some embodiments, this connection increases the voltage or increase the electron current for various types of application loads. In certain embodiments, this also causes the anode to emit electrons, reversing the current. In suitable instances, there are certain applications, where a current reversal is required after the application of certain voltages; these applications in some instances include AC voltage regulation or coupling.

BRIEF DESCRIPTION OF THE DRAWINGS

A system and method in accordance with aspects of the present invention is disclosed herein in accordance with the attached drawings in which.

DETAILED DESCRIPTION OF THE INVENTION

Figure 1:
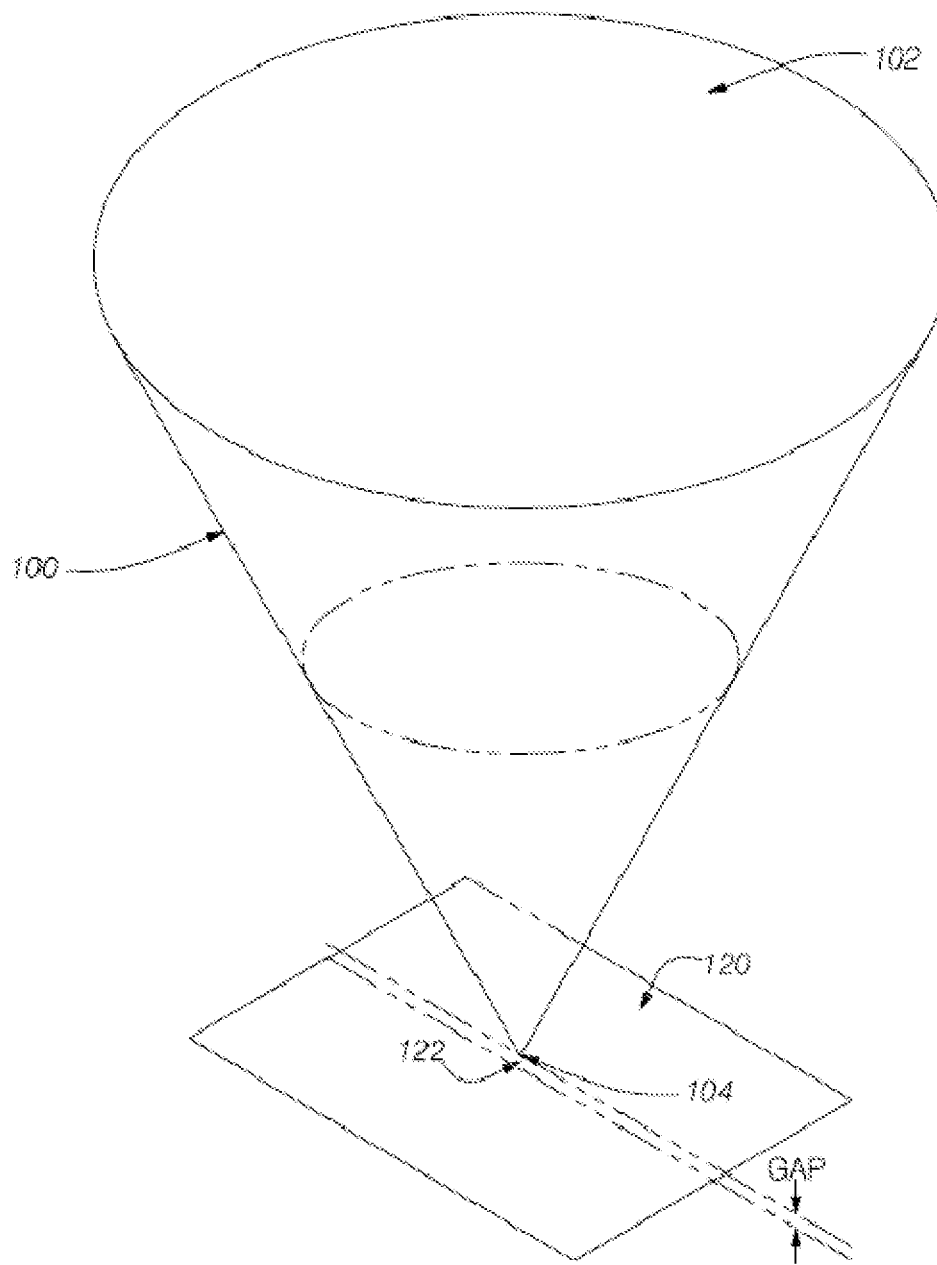
FIG. 1 illustrates a perspective view of an embodiment of a tapered waveguide collecting structure wherein light (or energy at another wavelength of the electromagnetic spectrum) enters from the top into the waveguide, which is the base of the inverted tapered structure, in accordance with an embodiment of the invention.

The drawings and the following description illustrate preferred embodiments of a system and method for implementing the present invention. In some embodiments, other shapes and configurations are also used to create the disclosed effect of collecting the electric field from the electromagnetic wave and funneling the electric field to a localized field region above a conducting plane where electrons are emitted from the distress field point or line.

The term "waveguide," as used herein, refers to a structure or device that guides waves, such as electromagnetic energy.

The term "electromagnetic energy," as used herein, refers to electromagnetic radiation (also "light" herein), which is a form of energy exhibiting wave-like behavior. Electromagnetic radiation includes radio waves, microwaves, infrared radiation, visible light, ultraviolet radiation, X-rays and gamma rays. Electromagnetic radiation includes photons, which is the quantum of the electromagnetic interaction and the basic of light.

The term "adjacent," as used herein, includes next to or adjoining, such as in contact with, or in proximity to. A layer, device or structure adjacent another layer, device or structure is next to or adjoining the other layer, device or structure. In an example, a first structure that is adjacent a second structure is directly next to the second structure. Adjacent components of any device described herein are in such contact or proximity to each other such that the device functions, such as for a use described herein. In some instances, adjacent components that are in proximity to each other are within 20 microns of each other, within 10 microns of each other, within 5 microns of each other, within 1 micron of each other, within 500 nm of each other, within 400 nm of each other, within 300 nm of each other, within 250 nm of each other, within 200 nm of each other, within 150 nm of each other, within 100 nm of each other, within 90 nm of each other, within 80 nm of each other, within 75 nm of each other, within 70 nm of each other, within 60 nm of each other, within 50 nm of each other, within 40 nm of each other, within 30 nm of each other, within 25 nm of each other, within 20 nm of each other, within 15 nm of each other, within 10 nm of each other, within 5 nm of each other, or the like. In some instances, adjacent components that are in proximity to each other are separated by vacuum, air, gas, fluid, or a solid material (e.g., substrate, conductor, semiconductor, or the like).

The term "field enhancement region," as used herein, refer so a structure or device that enhances or focuses an electric field in a waveguide or structure in optical communication with the waveguide.

The term "electrode," as used herein, refers to a conductor through which electrons enter or leave a device or structure. In some cases, an electrode includes an anode of a device. In other cases, an electrode includes a cathode of a device.

Field Enhancing Energy Collection Devices

In an aspect of the invention, field-enhancing energy collection devices are provided. In an embodiment, a field-enhancing energy collection device comprises a substrate. The substrate comprises a base surface having at least one recessed structure having one or more angled wall surfaces that taper downward and away from the base surface, between which angled wall surfaces is formed a recess void. The recess void is empty or filled with a transparent or translucent material. The one or more angled wall surfaces come in contact with, or in close proximity to, the base surface. The one or more angled surfaces comprises an electromagnetic energy conducting waveguide material, the electromagnetic energy conducting waveguide material being optically exposed to the recess void. The device further includes an electrode adjacent the substrate. In some cases, the electromagnetic energy conducting waveguide material includes a cathode of the device and the electrode includes an anode. Alternatively, the electromagnetic energy conducting waveguide material includes the anode and the electrode includes the cathode. The device comprises a distance ("gap") between the anode and the electromagnetic energy conducting waveguide material of the recessed structure. In some situations, the distance for the gap is below about 100 nanometers ("nm"), with optimal distances depending on material morphology. In an embodiment, for smooth surfaces the distances are between about 1 nm and 60 nm, or 5 nm and 30 nm. In certain embodiments, the distance ("gap") is about 1 nm to about 500 nm, about 1 nm to about 200 nm, about 1 nm to about 100 nm, about 1 nm to about 50 nm, about 1 nm to about 20 nm, about 20 nm to about 100 nm, about 20 nm to about 50 nm, less than about 20 nm, less than about 50 nm, or any suitable distance. In some instances where the electrons emit from the waveguide material to the anode, the distance ("gap") is about 1 nm to about 500 nm, about 1 nm to about 200 nm, about 1 nm to about 100 nm, about 1 nm to about 50 nm, about 20 nm to about 100 nm, about 20 nm to about 50 nm, less than about 50 nm, or any suitable distance. In some instances where the electrons tunnel from the waveguide material to the anode, the distance is about 1 nm to about 50 nm, about 1 nm to about 20 nm, less than about 20 nm, or any suitable distance.

Figure 9:
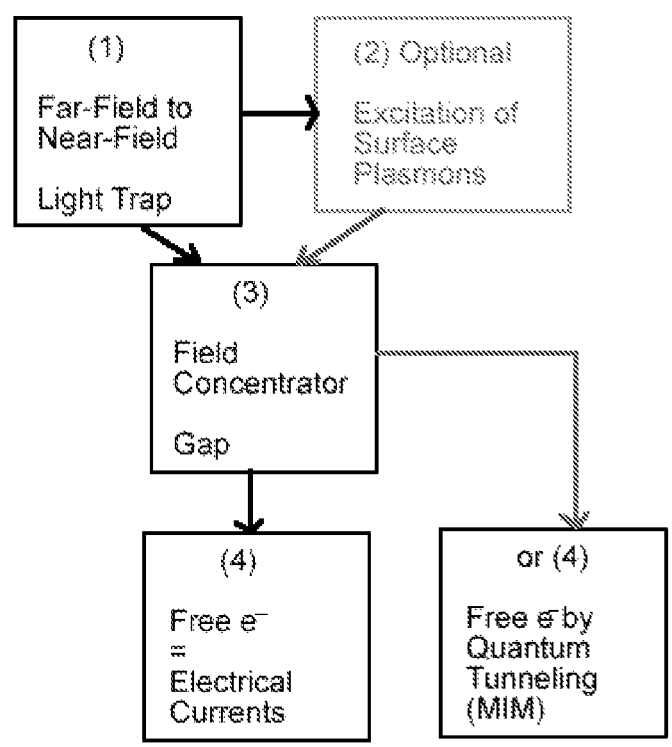
FIG. 9 shows a functional block diagram of optical antennas, in accordance with an embodiment of the invention.
Figure 10:
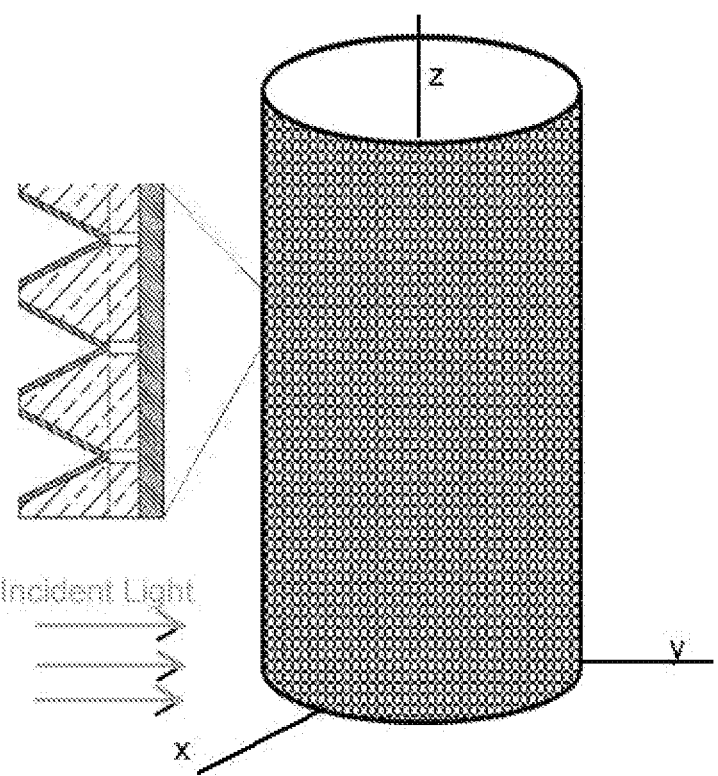
FIG. 10 schematically illustrates embedding optical antenna nano-structures into macro geometries, in accordance with an embodiment of the invention.

FIG. 9 shows a functional block diagram of optical antennas provided herein, in accordance with an embodiment of the invention. The diagram shows three fundamental building blocks for a far-field to near-field light trapping by geometrical waveguides. An optional excitation of surface plasmon occurs depending on the resonating frequencies of the selected metal and dielectric substrates. The field concentration region leading to a gap located in the vicinity of the ground plane is responsible of aggregating resonating fields in order to free electrons to the ground plane surface. Electrons are also freed (or generated) via quantum mechanical tunneling (also "quantum tunneling" herein) by selecting the material and/or configuration of metal-insulator-metal ("MIM") layers along the inner layers of the geometrical waveguides and/or above the ground plane. The functionalities of these building blocks and their corresponding interconnections are fundamentally different from conventional near-field or photovoltaic effects. Furthermore, in some cases such nano-structure optical antennas are fabricated as arrays on rigid or flexible sheets or substrates to allow additional flexibility with integration. In an example, flexible sheets conform to a given geometrical shape, such as the one depicted in FIG. 10, to allow electromagnetic near-field manipulation via conformal mapping or sensing the directionality of incident light. For example, in FIG. 10, incident electromagnetic energy ("light") propagating along a vector parallel to the y-axis is more effectively captured by nanostructures located along the negative y-axis. In some cases, such nanostructures more effectively sense the directionality of incident signal. In some applications, this enables the mapping or sensing of the directionality of incident light. That is, waveguides oriented along the y-axis generate more electrons per unit time (or "current") than waveguides oriented along the x-axis, which does not appreciably (or detectably) generate any electrons in response to light oriented along the y-axis. By determining which waveguides or groups of waveguides generate the most current, the directionality of incident light is determined.

In some embodiments, the gap between the electrode and the electromagnetic energy conducting waveguide material of the field-enhancing energy collection device comprises a vacuum void, substrate, or a combination thereof. In some embodiments, the electromagnetic energy conducting waveguide material is the cathode. In other embodiments, the cathode is separate from the electromagnetic energy conducting waveguide material. In certain embodiments, the electromagnetic energy conducting waveguide material and/or cathode comprises or is comprised of a conducting material, such as one more materials selected from the group consisting of Al, Ag, Au, Cu, Ni, Pt, Mn, Mg, W, Ti, Ru, Rh, C or Graphene.

In some embodiments, the substrate of the field-enhancing energy collection device is a non-conducting or semiconducting material. The substrate comprises a dielectric, plastic, ceramic, a semiconductor, or combinations thereof.

Figure 3A:
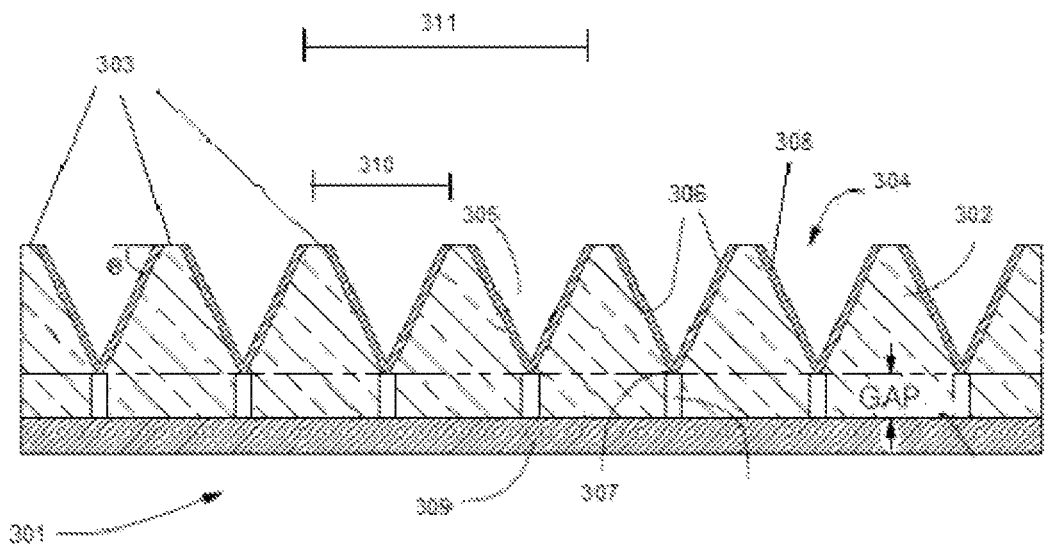
FIGS. 3A and 3B illustrate cross-sectional elevational views of the array of waveguide, structures along which cathodes will be located, of FIG. 2 and show a dielectric between the cathodes and a conducting ground plane (anode), in accordance with an embodiment of the invention.

In some embodiments, the base surface dimensions 310 (e.g., the width, diameter, length, or the like of the recessed structure at the base surface of a system or device described herein—see 310 in FIG. 3A) of the recessed structure is any suitable size. In certain embodiments, a base surface dimension which is defined as the opening on surface 303 of FIG. 3A, were the dimension is a cross sectional dimension (e.g., diameter if the opening is circular), or an edge dimension (e.g., the length of a side for polygonal opening, or the circumference of a circular opening), or the like. In some embodiments, the base surface dimension (such as a cross sectional surface, e.g., diameter for a circle, or an edge dimension) is greater than about 5 nm, greater than about 20 nm, or greater than about 100 nm, or greater than about 250 nm, or greater than about 500 nm, or greater than about 1 micrometer ("micron"), or greater than 2 micrometers, or about 5 nm to about 5 microns (e.g., for visible), or about 5 nm to about 20 microns (e.g., for visible and infrared), or about 5 microns to about 20 microns, or about 10 microns to about 20 microns (e.g., for infrared), or the like In some embodiments, the substrate of the field-enhancing energy collection device is in contact with both the electromagnetic energy conducting waveguide material and the anode. In certain embodiments, the recessed structure is conical, pyramidal, polygonal, a linear track, or a circular track.

In some embodiments, the recess void comprises a vacuum or inert material. In certain embodiments, the inert material is an inert gas or inert solid.

In other embodiments, the recess void comprises a semiconducting photovoltaic ("PV") material, such as an organic PV material. In certain embodiments, the organic photovoltaic material comprises $TiO_2$ and an electrolyte.

In some embodiments, the field-enhancing energy collection device further comprises a transparent overcoat protection layer.

In some embodiments, the electromagnetic energy conducting waveguide material of the field-enhancing energy collection device is situated on a surface of the recessed structure. The field-enhancing energy collection device comprises a plurality of recessed structures.

In some situations, the electromagnetic energy conducting waveguide material of the plurality of recessed structures are interconnected by electromagnetic energy conducting waveguide material on a surface of the substrate opposite the base surface. In certain embodiments, each of the plurality of recessed structures includes an isolated anode that is spaced apart from the recessed structure. In an embodiment, the isolated anode is spaced apart from the recessed structure with the aid of a gap. The gap electrically isolates the anode from the plurality of recessed structures. In some cases this enables the device to act as an image generating sensor.

In some embodiments, the anode comprises a flat surface spaced apart from the electromagnetic energy conducting waveguide material.

In certain embodiments, the anode comprises a flat surface spaced apart from the electromagnetic energy conducting waveguide material and further comprises a protrusion from the flat surface, wherein the gap between the anode protrusion and the electromagnetic energy conducting waveguide material is less than the gap between the anode flat surface and the electromagnetic energy conducting waveguide material.

Exemplary FIG. 1 is a perspective view of a tapered waveguide collecting structure 100 of a certain embodiment of the systems and methods described herein. The collecting structure comprises a conducting material that tapers from a base 102 to a point 104. In some embodiments, the conducting material is a thin conducting film. In some situations, the conducting material comprises metals or metallic materials, such as gold, copper, silver, aluminum, graphene (a honeycomb crystal lattice of densely packed carbon atoms in a one-atom-thick planar sheet), or other carbon materials that are electrically conducting. In some embodiments, the conducting material is comprised of one or more conducting materials. In certain instances, the thickness of the conducting material is on the order of the wavelength of electromagnetic skin depth in the conducting medium.

As illustrated in FIG. 1, in one embodiment, the tapered collecting structure 100 is inverted such that the base 102 is located at the top and the point 104 is located at the bottom. The cone is "open" at the top such that the base 102 is transparent to electromagnetic radiation (e.g., visible and/or infrared light). In some embodiments, the cone is filled with an optically transparent material (e.g., transparent to visible and/or infrared light). In suitable instances, the base is directed toward the sun or other source of light or electromagnetic energy such that light (or energy at another wavelength of the electromagnetic spectrum) enters the waveguide via the top and propagates toward the tip emitter. In some embodiments, the base of the illustrated embodiment is circular. Other embodiments provide non-circular bases to create node points within the cone. Unlike typical waveguides, a common feature of the disclosed waveguides in some instances is that the waveguide tapers to a point or opening with a circular or polygonal shape. In other configurations having a non-circular cross section, the waveguide in certain instances tapers to a line.

Conical Waveguides

Figure 2:
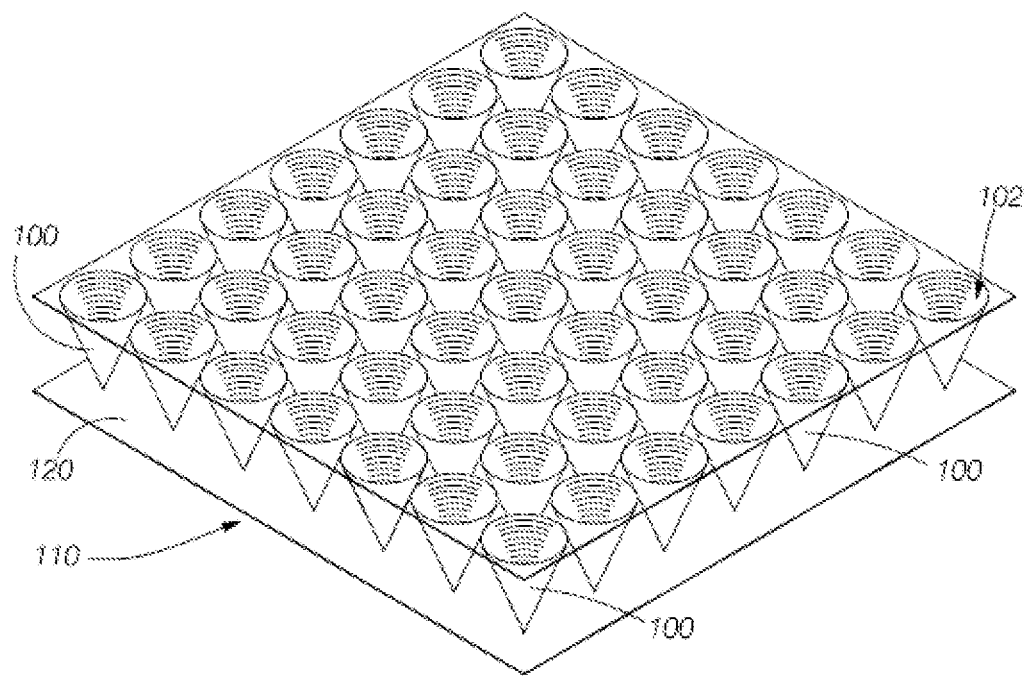
FIG. 2 illustrates a perspective view of an array of waveguides or cathodes over an anode, in accordance with an embodiment of the invention.
Figure 3B:
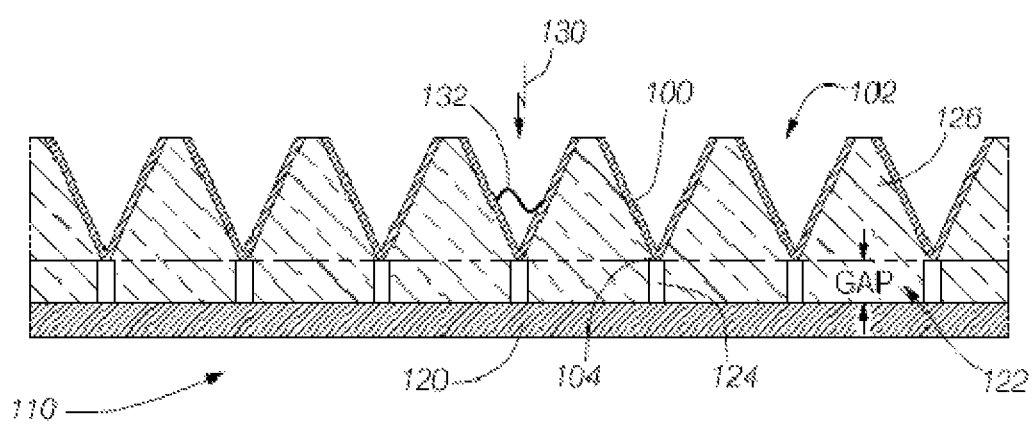

Exemplary FIG. 2 illustrates a perspective view of an array 110 of waveguides 100 according to certain embodiments of the invention. FIGS. 3A and 3B illustrate a cross-sectional elevational view of the array of waveguides of FIG. 2. As discussed below, each or one or more waveguide in some instances functions as a cathode (alternatively, a cathode is additionally included in a device described herein). As shown in FIG. 3B, the tip 104 of the waveguide is spaced apart from a conductive (or conducting) ground plane 120 by a gap (or standoff layer) 122. The gap 122 is defined by the tip 104 and a top surface of the conductive ground plane 120. In some embodiments, this region comprises the same material as region 126 (see FIG. 3B). In certain instances, the conducting ground plane comprises an electrical conductor and functions as an anode. In one embodiment of FIG. 3, an electron emission region 124 is positioned between each waveguide (e.g., also serving as a cathode) and the anode. In some embodiments, the waveguides are formed in a dielectric substrate 126 that includes the standoff layer 122 or into which the standoff layer 122 is formed.

The electromagnetic waves in suitable instances are incident from above the broad open end (base) of each individual conical waveguide 100. Each incident electromagnetic wave 130 creates a mirror electric field in the waveguide comprising the electrically conducting material. In suitable instances, light is reflected or guided inward via plasmon waves created at the interface of metal until the dimension of the tapered cross section (e.g., the diameter for a cone having a circular base) equals the wavelength of the electromagnetic wave. In some instances, the matching dimensions create a standing wave that partially traps a wave 132, as shown in FIG. 3B. Further, the electric field generated in the conductive waveguide by the wave in suitable instances is combined with the electric fields created by electromagnetic energy at other wavelengths to create a high field region at the point 104 at the tip of the waveguide. In some embodiments, the entire waveguide structure functions as a cathode or electron emitter. With sufficient localized field strength at the waveguide tip, the electrons in suitable instances overcome the work function of the metal to jump across the gap 124 to the ground plane (anode) 120.

In some embodiments, to optimize matching between trapping light and electron emission and to prevent electron return from the anode 120 to cathode point 104, a gap 124 that is under vacuum, filled with an inert gas, or layered with MIM, metamaterial structures, or other geometrical metallization that further enhance gap capacitance and matching conditions, is used between the cathode tip and the anode. In certain instances, the material comprising the gap is chosen based on the field strength, which is a function of the geometry and the intensity of the incident electromagnetic wave. For instance, the gap is filled with a gas, such as an inert gas. In some embodiments, the gas is the cause of additional electron production which further enhance the current generated and lower the electron emission energies. In some instances, this also has the effect of changing the standoff voltage across the cathode anode gap.

In some embodiments, as illustrated by the embodiment of FIG. 3B, an electrically insulating (or dielectric) standoff 122 is used to support the required distance between the tip 104 of the cathode 100 and the anode 120. In some instances, the choice of materials for the dielectric standoff is determined at least in part by one or both of the dielectric field strength and the manufacturing cost. In some embodiments, silicon oxides, plastic and/or ceramics are used as the dielectric standoff 122. In other embodiments, the distance between the cathode tip 104 and the anode (ground plane) 120 is less than about 100 nanometers ("nm"), or 90 nm, or 80 nm, or 70 nm, or 60 nm, or 50 nm, or 40 nm, or 30 nm, or 20 nm, or 10 nm, depending on the optical energy collecting application.

Figure 4:
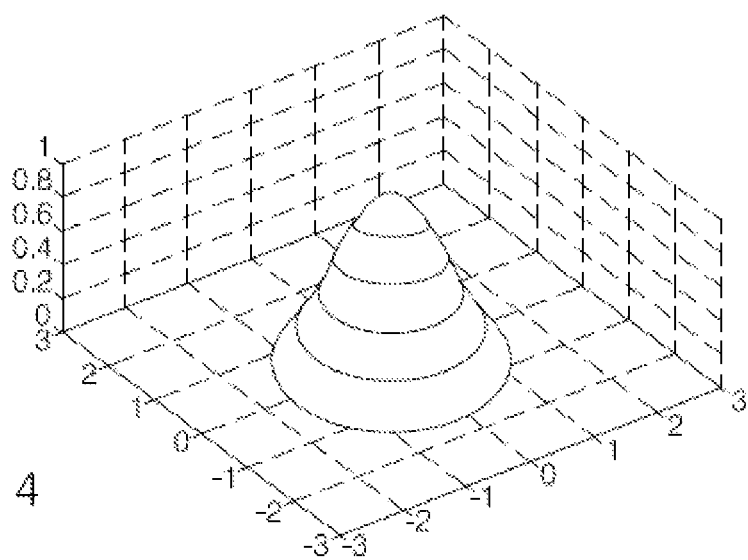
FIG. 4 illustrates the enhancement of the electric field at the tip of a collecting cone, in accordance with an embodiment of the invention.

Without wishing to be bound by theory, FIG. 4 illustrates the enhanced field at the tip 104 of the waveguide 100. In FIG. 4, the tip of the waveguide is pointing upward for convenience in presenting the graph. The units in FIG. 4 are normalized with respect to a maximum field at the location of the tip positioned at relative coordinates (0, 0). When free electrons in the electrically conducting material in the cathode or waveguide 100 interact with the electric field of the electromagnetic wave, in suitable instances the free electrons oscillate at the frequency of the electromagnetic wave, as long as the plasma frequency for the metal is above the electromagnetic wave frequency. In some cases, such resonance phenomenon gives rise to field enhancement at the tip. In some embodiments, the resonance is not through plasmonic coupling but through the geometry of the optical antenna. In such a case the resonance is a function of the varying size of the antenna horn itself, creating a field compression region at the tip.

Figure 5A:
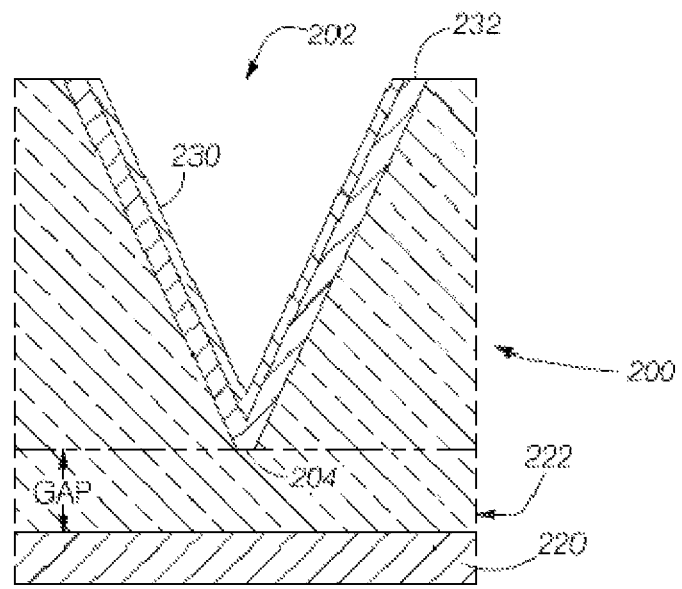
FIGS. 5A and 5B show tapered waveguide structures with an inverted anode pointing to each cathode, to increase the localized field enhancement, in accordance with an embodiment of the invention.
Figure 5B:
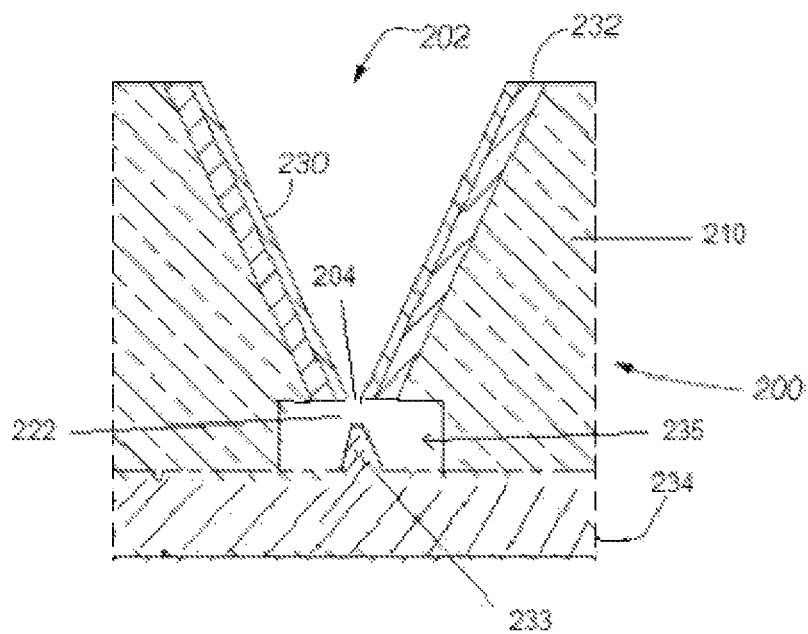

Exemplary FIGS. 5A and 5B illustrate detailed cross-sections of a conical waveguide collector 200 having an upper base 202 and a lower tip (cone point) 204, in accordance with some embodiments of the invention. In some instances, the tip 204 is spaced apart from a ground layer (anode) 220 by a gap 222 as shown in FIG. 5A. In some instances the tip is an opening with a circular or polygonal shape as shown in FIG. 5B (204). In some embodiments, the wall forming the waveguide collector comprises a dielectric 230 metal layer 232. The electric field in some instances propagates to the cone point 204. Plasmon surface waves create a coupling of the light wave to the metal surface wave, thereby creating a waveguide. The plasmon wave is dependent on various factors, such as frequency, material and thickness. Plasmons are discussed in detail in, for example, S. Maier, *Plasmonics: Fundamentals and Applications*. Springer. (ISBN 978-0387331508) (2007); H. Atwater, "The Promise of Plasmonics", *Scientific American* 296 (4): 56-63 (2007); and Dione, Sweatlock, Atwater and Polman, *Plasmon slot Waveguides: Towards chip-scale propagation with subwavelength-scale localization, Physical Review B* 73, 035407 (2006), which are entirely incorporated herein by reference.

In some instances, surface plasmons couple the electromagnetic field energy of the incident light wave to the conductive region and propagate energy along the interface of conducting region 232 of the waveguide and either insulating 230, dielectric 230, gas (202) or vacuum region 202. In an embodiment, the region 230 is translucent to the wavelength of light to be collected. In some instances, the region 230 is also used to preferentially absorb certain wavelengths of light to either filtering the light or creating regions for downshifting the light, as with photolumiscence materials. In some embodiments, a plasmon surface wave is enhanced or modified by placing a thin dielectric layer or a different conducting material (e.g., metal, semiconductor, graphene) over the metal layer. Surface plasmon waves that traverse a dielectric and conducting interface in some instances are controlled by features on the surface, as shown in Pendry, Martin-Moreno, Garcia-Vidal, *Mimicking Surface Plasmons with Structured Surfaces, Science* 305, 847 (2004); DOI: 10.1126/science.1098999, which is entirely incorporated herein by reference. In some embodiments, light trapping and electron emission are further enhanced by incorporating slanted or cylindrical surfaces at the top or bottom portion of the tapered structure, or by including grooves or some sort of surface roughness along the inner surface of the sloping geometry, or by including metamaterial resonating structures or MIM layer along the inner side.

In some embodiments, such as FIG. 5A, the anode 220 is a flat plane across from the cathode tip(s) 204; in other embodiments, such as FIG. 5B, the anode 234 includes an inverted conducting tip 233 to further enhance the electric field generated upon propagation of light in the collector 200. In general, there is a gap 235 to provide an electrical standoff between the cathode 204 and anode 234. In some embodiments, the gap 235 is, is made up of, or comprises a vacuum, filled with a gas (e.g., an inert gas) or other material (e.g., substrate material as described herein). In certain embodiments, a vacuum is used when the design requires no interaction of material with the electron as it transports across the gap 222. However a gas in suitable instances is used to interact with the electrons to either slow the electrons or too transfer energy from the electrons and create more electrons but with lower energies. In certain instances, the material in the gap affects the field strength, allowing a tailoring of the emission for specific incident light intensities and energies and therefore tailoring the final electron emission to the environment.

Figure 11A:
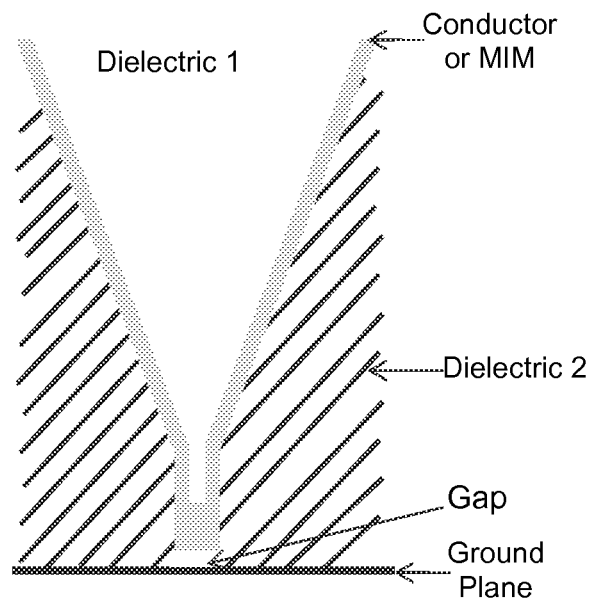
FIG. 11 illustrates variations of tapered structures, in accordance with an embodiment of the invention.
Figure 11B:
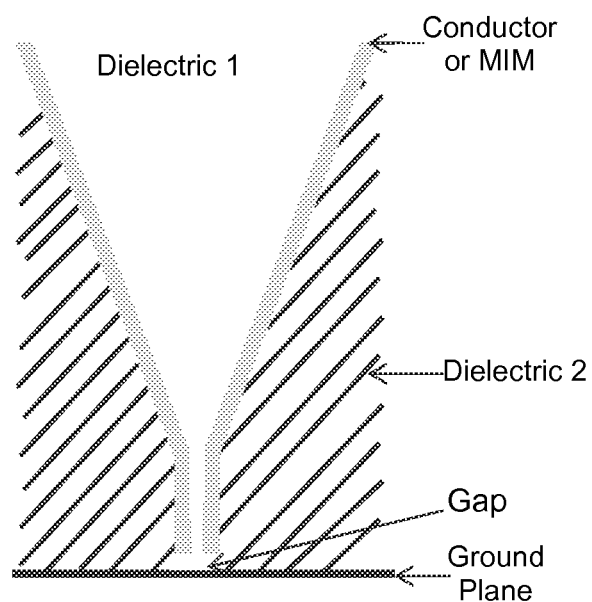
Figure 11C:
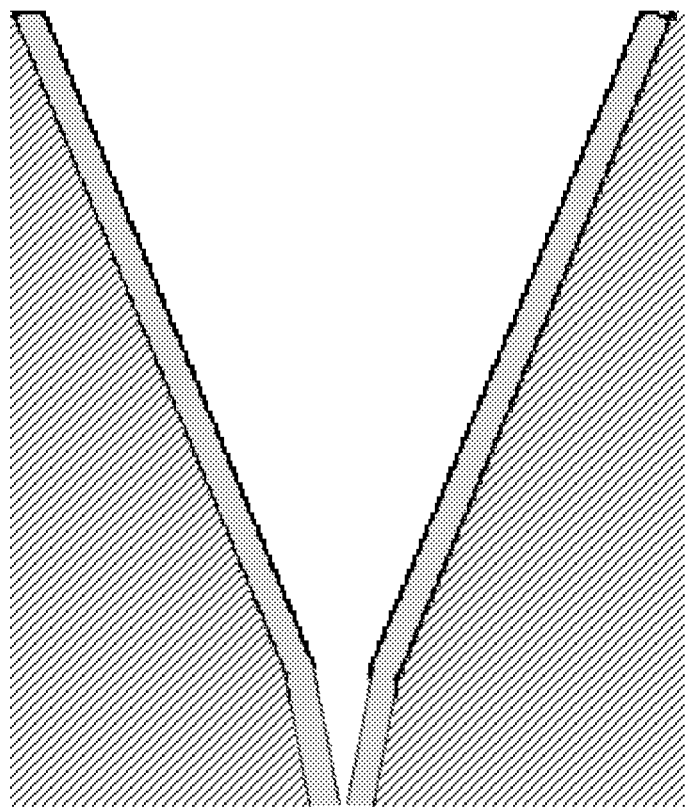

In some embodiments of the tapered structure has more than one taper shape, such as shown in FIGS. 11A, 11B, and 11C. In some instances, the taper proximal to the base surface of the device has a first angle and distal to the base surface (or at or proximal to the tip) of the device has a second angle or other shape (e.g., a convex, concave, rounded, or the like shape), such as orthogonal to the base surface. In some instances, the tip of the tapered structure includes a sharper tapered region with a gap toward the bottom as illustrated in FIG. 11C, e.g., to further increase field intensity, and hence electron emission. The tapered structures illustrated in FIG. 11 are separated from the ground plane 220 with the gap 222, as illustrated in FIG. 5B. The ground plane includes a top MIM layer, e.g., to further enhance electron emission. In some embodiments, the gap 235 includes a vacuum, filled with a gas (e.g., an inert gas) or other material (e.g., substrate material, as described herein). In certain embodiments, a vacuum is used when the design requires no interaction of material with the electron as it transports across the gap 222. However, a gas in suitable instances is used to interact with the electrons to either slow the electrons or too transfer energy from the electrons and create more electrons but with lower energies. In certain instances, the material in the gap also affects the field strength, allowing one to tailor the emission for specific incident light intensities and energies and therefore tailor the final electron emission to the environment.

In some embodiments, gaps between anodes and cathodes is under vacuum at a pressure less than about 760 torr, or 1 ton, or $1\times10^{-3}$ ton, or $1\times10^{-4}$ ton, or $1\times10^{-5}$ torr, or $1\times10^{-6}$ ton, or $1\times10^{-7}$ ton, or $1\times10^{-8}$ ton, or $1\times10^{-9}$ torr. In some cases, the walls of the anode and cathode defining the gap are hermetically sealed to provide a vacuum at a desirable pressure. The pressure is selectable so as to effect a desired emission in the region between the cathode and anode.

By way of non-limiting exemplary FIG. 1, varying cross-sectional diameter of a certain embodiment of the conical waveguide 100 (or distance across a cross section for other shapes) is preferably to be on the order of the wavelength of the electromagnetic radiation being collected. Varying the distance from the conical waveguide top surface to the bottom tip may improve matching conditions and electron emission. For collecting visible light, the inner diameter of the cone in some embodiments varies between approximately 800 nanometers to under 400 nanometers. In some cases, the diameter is also increased or decreased based on harmonics of the wave with the harmonic dimension described by $n\lambda/2$, where 'n' is an integer and '$\lambda$' is the wavelength of the electromagnetic wave. In one embodiment, the diameter is a multiple of wavelengths for other applications. In certain embodiments, the inner diameter closest to the point is sufficiently small so the cone is able to collect electromagnetic energy in the ultraviolet range.

In certain embodiments, the waveguide comprises an electrically conducting metallic medium that has a plasma frequency above the desired collecting frequency of light. The plasma frequency, $\omega_{pe}$ (in radians per second), is defined as:

$$\omega_{pe} = \left(\frac{n_e e^2}{\varepsilon_o m_e}\right)^{1/2} \text{rad/s}$$

where '$n_e$' is the electron density, 'e' is the electric charge, '$\varepsilon_o$' is the permittivity of free space and '$m_e$' is the mass of an electron. The frequency is then $fp = \omega_{pe}/2\pi$.

In some embodiments, metals, such as, for example, gold, silver, aluminum, platinum, or composite metals, are used for visible light collectors. In certain instances, some metals, such as copper, have a plasma frequency in the visible range, yielding a distinct yellow color. In some situations, such metals are less favorable materials for full spectrum applications because they exclude collection of some of the electromagnetic spectrum. In other situations, such metals are preferable candidates for applications in which light of higher frequency is to be filtered out. In such applications, the disclosed system filters light of a particular or predetermined frequency. The plasma frequency of metals and material are known by those in the art and are chosen depending on the spectrum of electromagnetic radiation that is to be collected.

The thickness of the metal is also important to consider; insufficient amount of metal may generate a significant amount of transmission of the electromagnetic energy into the substrate. Also the smoothness of the metal is also important, especially between the metal and the recess void. The optical properties of the metal may change if the metal surface is too rough or corrugated. Likewise, if the metal is thin and on the order of the optical frequency skin depth or less, the roughness of the metal substrate interface may also affect the response of the waveguide.

In addition, disclosed herein is electron emission off of an array of structures similar that shown in FIG. 5A or 5B.

Figure 6:
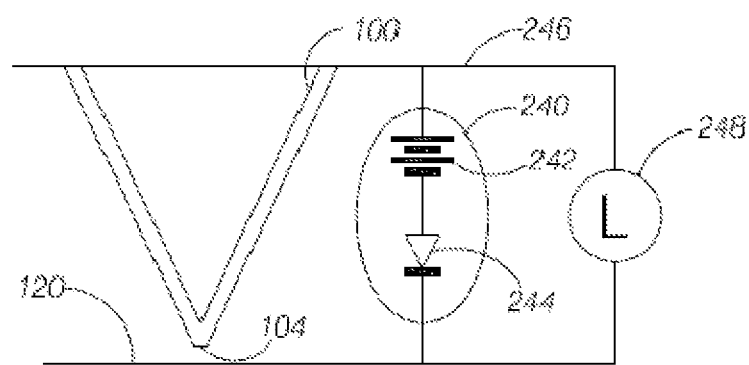
FIG. 6 illustrates an electrical circuit for a variation of system that uses a low current or zero current voltage source to increase the voltage across the gap between the ground plane and electron emitting tip of the collecting structure, in accordance with an embodiment of the invention.

In suitable instances, when the field is sufficient or the localized electron density is sufficient, electrons are emitted from the tip 104 of the cathode (waveguide) 100 to the anode (ground plane) 120 in the embodiment of FIGS. 1-3. In some embodiments, the field is modified by placing a high-resistance voltage source 242 of FIG. 6 in parallel with the cathode to anode path. In other embodiments, as shown in FIG. 6, a voltage source 240 comprises a direct current (DC) source (e.g., battery, or an inherent voltage from dissimilar metals or a semiconductor bandgap) 242. In some situations, a diode 244 is added to restrict the backflow of electrons from the anode to the cathode. The voltage source is positioned in parallel with the cathode-to-anode path between a top conducting plane 246 and the anode. In some embodiments, this voltage source is also an alternating current (AC) source to create a coupling current to an external (or outside) load. In some embodiments, the top conducting plane interconnects the plurality of waveguides 100 (FIG. 2). By way of a non-limiting example, a load 248 is connected between the top conducting plane and the anode (ground plane). In an example, the load is any device that uses electrical energy (or power) generated by devices and structures provided herein. The embodiment illustrated in FIG. 6 is particularly useful when the waveguides are used in low intensity environments, such as in sensor applications. In an alternative embodiment (not shown), two or more waveguides are placed in series to increase the generated voltage.

In some embodiments, the plurality of conical waveguides 100, such as those shown in FIGS. 2 and 3, are tightly packed to occupy as much of the surface area as possible in order to maximize the collection area. In other applications the spacing between the waveguides is used to create surface plasmon waves that are dependent on the distances between the waveguides, adding an additional resonant mode. The current produced by the multiple waveguides is a function of the light intensity, the geometries and metals used in the waveguides, the energy associated with the spectrum and the overall resistance. In some embodiments, the multiple waveguides are manufactured using simple materials that embed the tapered geometry in a double metal dielectric layer similar to Mylar sheets. In certain embodiments, the thickness of the entire device is less than four micron, or less than 1000 nanometers ("nm"), or less than 500 nm, or less than 100 nm. In other embodiments, a thicker anode is used to provide structural support, increasing the overall thickness to over 4 microns. As discussed above, in certain embodiments, a vacuum or gas is embedded in the emission region 124 between the tips 104 and the ground plane 120. In other embodiments, other insulating materials are also used. In some embodiments, the distance between the tips and the ground plane is maintained (and the tips and ground plane are electrically insulated) with the aid of insulating standoffs 122. The embedded gas or vacuum in the emission region 124 allows for tailoring the electron emission energy and the number of electrons produce based on the intensity and energy of the incident electromagnetic waves.

Tube Waveguide

Figure 7:
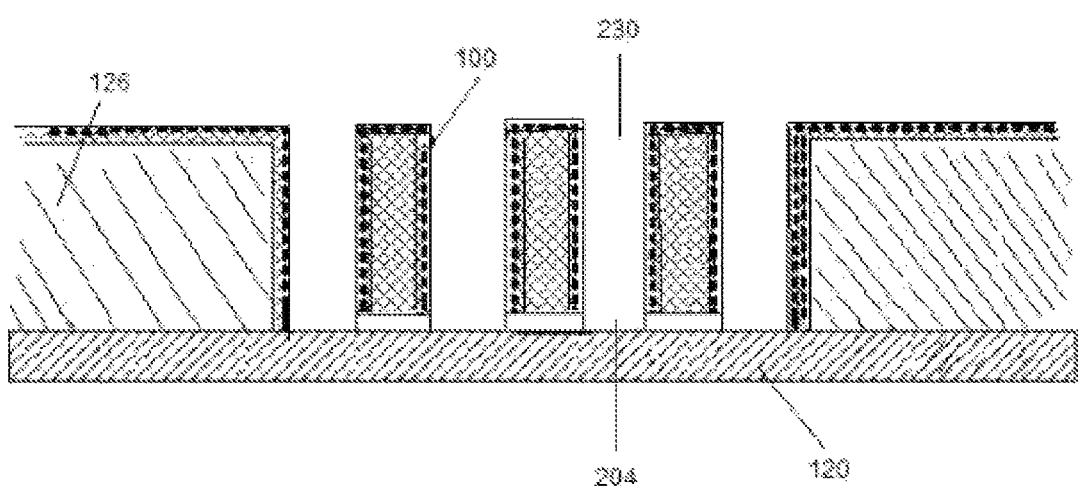
FIG. 7 shows a specialized structure where the waveguide structure is designed to collect a more narrow spectrum of wavelengths of light, this structure is not tapered and is a cylinder, in accordance with an embodiment of the invention.

In some embodiments, exemplary FIG. 7 shows an alternative version for specific wavelength collection. The waveguide is a tube ($\Theta$ is 90 degree), with conducting material 100, cathode emitter 204 and anode plane 120. The structure is supported in one embodiment by insulating material 126 and the inside of the cones are filled with transparent material 230 chosen for translucence and the effect on electron emission and the effect on the field strength between the cathode and anode. In another embodiment, this option is also modified by an inverted anode structure (not shown) but similar to 233 in FIG. 5B.

Figure 8:
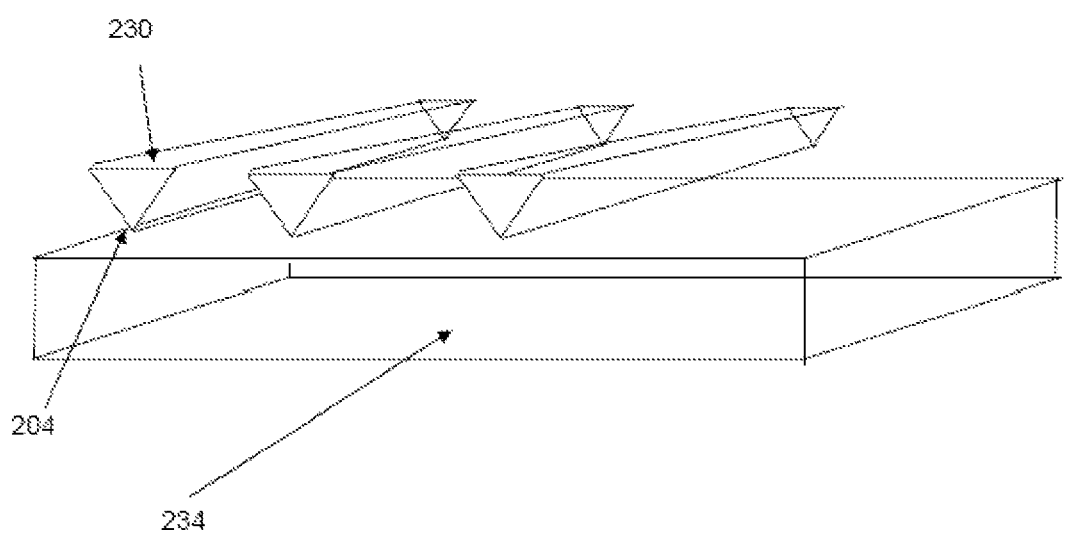
FIG. 8 shows a track structure were each cathode is a continuous region. The emission region is formed by the tapered lower region of the device, in accordance with an embodiment of the invention.

Exemplary FIG. 8 shows another embodiment of the invention where the tapered structures are in a track configuration. In some embodiments, these structures are concentric circles or in spiraling shapes. In this configuration the cathode emitter 204 is a continuous surface above the anode 120. The material in the gap region 235 is similar to that described in the other embodiments of the device. In some embodiments, this configuration has advantages for manufacturing specific regions that are isolated from other collection regions and create additional resonant frequencies that are collected based on the distance between the track regions through surface plasmons.

Light Collection and Enhancement Structures

In another aspect of the invention, a field-enhancing energy collection device includes one or more field enhancement regions (or structures), which are configured to provide electric or magnetic field enhancement to the field-enhancing energy collection device (or antenna). Field enhancement regions are applicable with various field-enhancing energy collection devices provided herein.

Field enhancement regions provided herein include one or more field enhancement structures. In some cases, field enhancement structures include one or more structures with sharp points, such that the electric field at one or more tips of the one or more structures diverges (or approaches divergence) (see, e.g., FIG. 11C). In some cases, such as FIG. 5B, the anode has a pointed electrically conducting structure 233 pointing toward the cathode to further enhance the field. In other cases, a field enhancement structure includes a quantum mechanically tunneling ("tunneling") junction, such as that shown in FIG. 12B using a thin insulator or oxide 5.

An individual waveguide in an array of waveguides includes a field enhancement region. Alternatively, an array of waveguides includes a field enhancement region.

In an embodiment, field enhancement regions are disposed adjacent an electrode (e.g., anode) of a field-enhancing energy collection device and a waveguide (e.g., cathode) of the device. In another embodiment, field enhancement regions are in contact with an electrode of the device.

Figure 12A:
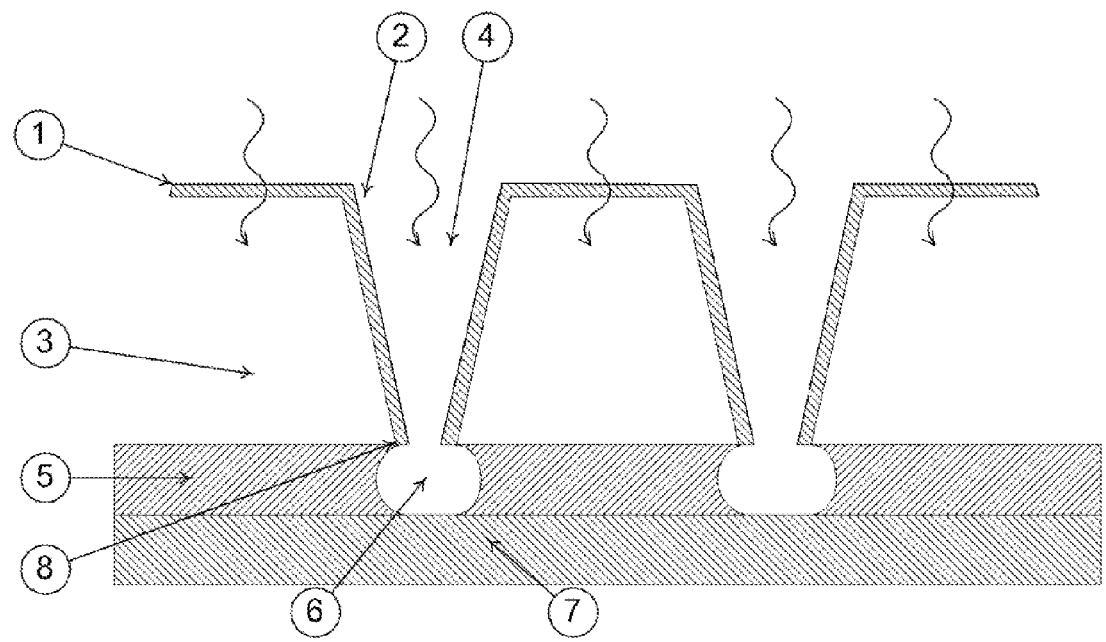
FIG. 12A illustrates an optical waveguide having a field enhancement region, in accordance with an embodiment of the invention.
Figure 12B:
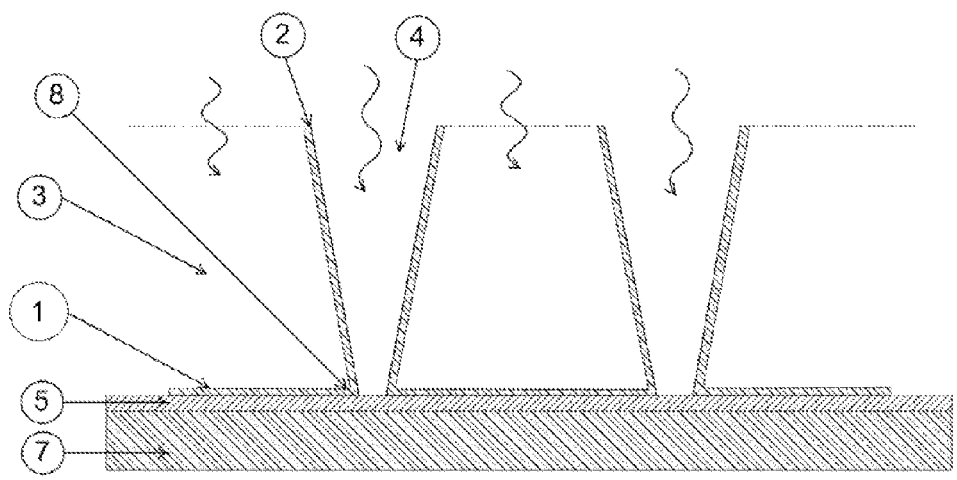
FIG. 12B illustrates an optical waveguide having a field enhancement region, in accordance with an embodiment of the invention.

FIG. 12A shows an optical waveguide, in accordance with an embodiment of the invention. FIG. 12B shows a device for providing an alternative mode of rectification from FIG. 12A, in accordance with an embodiment of the invention.

With reference to FIG. 12A, the optical waveguide includes an optically transparent top surface 1, a light collection layer 2, support structure 3, hollow tapered body 4, electrical insulator 5, a gas or vacuum region 6, an electrical return plane 7, and an emission region 8. The electrical return plane 7 is referred to as a collector or electrode, in some cases. In some situations, the collector 7 is an anode and the top surface 1 is a cathode. In an embodiment, the top surface 1 and collector 7 are electrodes.

In some embodiments, the structure of FIG. 12B enhances the potential field absorption by allowing light to enter on both sides of the light collection and enhancement structure 2. Light enters the optical waveguide through the top of the structure, as indicated. In an embodiment, the supporting structure 3 is formed of an optically transparent material.

In some cases, the device of FIG. 12A includes an electrically conductive material covering the support structure 3, which enables electrical current to flow to the waveguide 2. In an embodiment, this material is optically transparent, allowing light to enter both sides of the recessed structure. In one example, material indium tin oxide (ITO) is used as the electrically conductive material covering the support structure 3. In another example, other electrical conductors that are transparent to the desired collection wavelengths are used. In an embodiment, the light collection and enhancement structure 2 is a tapered structure formed of a metal (e.g., one or more of Ag, Al and Au), graphene, or other electrically conductive material having a plasma frequency to enable electrons in the material to respond to light frequencies to be collected in the structure. The light collection and enhancement structure 2 is supported by the support structure 3. In some situations the support structure 3 is optically transparent.

In FIG. 12A, electron emission is used for rectification. In some embodiment, the electrical insulator 5 has a thickness between about 1 nanometer ("nm") and 40 nm, or 10 nm and 300 nm, or 20 nm and 100 nm. The emission region 8 is formed of a sharp or substantially sharp tip, the sharp tip creating higher field to enhance electron emission. In some situations, the enhanced field at the emission region 8 causes electrons to overcome the work function and traverse the gas or vacuum region 6. The electrons are then be collected by the electrical return plane 7, which is formed of an electrically conductive material. In FIG. 12A, light enters both into the open collector region 4 and through the optically transparent support structure 3 and is concentrated through resonance, geometric compression and plasmonic waves to create field enhancement at the emission region 8 due to the tapered shape. In some situations, the hollow tapered body 4 has the shape of a cone. Resonance occurs through wavelength scale geometries and harmonics in the tapered region. This creates an enhanced field on the inner surface with a high field region at the emission region 8. In some situations, light also enters through top surface 1 and into the support structure 3. In some cases, the top surface 1 is an electrical contact of the device of FIG. 12A. The top surface 1 is optically transparent but conducts electricity. Upon entering the support structure 3 through the top surface 1, light is concentrated on the outer metal surface 2. The support structure 3 is optically transparent to allow light into the structure. In an embodiment, the thickness of the light collection and enhancement surface (or structure) 2 is greater than the skin depth of the desired light collection frequencies in the particular metal. For example, the light collection and enhancement structure 2 has at thickness between about 1 nm and 500 nm, or 5 nm and 100 nm. For cases in which the light collection and enhancement structure 2 is formed of Al, Ag or Au, the thickness of the light collection and enhancement structure 2 is greater than about 5 nm, or 10 nm, or 40 nm, or 50 nm.

In an embodiment, the plane 7 is in electrical communication with a load, which is in electrical communication with the top surface 1. Upon exposure of the light collection and enhancement structure 2 light, electrons are emitted from the emission region 8 and collected at the plane 7. Electrons subsequently travel to the load and return to the top surface 1.

In some embodiments, the device of FIG. 12B employs a metal insulator metal (MIM) structure for electron tunneling across an insulating layer of the MIM structure. The MIM is defined by the light collection layer 2, insulator 5 and collector 7. In the device of FIG. 12B, electrons from field concentration point 8 tunnel across the insulator 5 to the collector 7. For this configuration, the thickness of the insulator is substantially thin to allow for electron tunneling across the insulator. In some situations, the thickness of the insulator is calculated using Simmons electron tunneling approach, in which case the insulator has a thickness between about 1 nm and 30 nm. In other embodiments, the MIM structure is combined with or modified by other quantum mechanical tunneling diodes, such as those described in Cowell et al., Adv. Mater. 2011, 23, 74-78) and Dagenais et al., "Solar Spectrum Rectification Using Nano-Antennas and Tunneling Diodes", Optoelectronic Integrated Circuits XII, Proceedings of SPIE Volume: 7605 (12 Feb. 2010), which are entirely incorporated herein by reference In some implementations, the insulator 5 includes an oxide, such as a metal or insulating oxide. In an example, the insulator 5 is formed of titanium oxide (e.g., $TiO_2$), aluminum oxide (e.g., $Al_2O_3$), and/or silicon oxide (e.g., $SiO_2$). In some cases, the insulator is chosen for various properties that include standoff voltage and the ability to manufacture and deposit in a smooth fashion on anode 7.

In some embodiments, the insulator 5 is formed using atomic layer deposition (ALD), plasma-enhanced ALD, chemical vapor deposition (CVD), or plasma-enhanced CVD, to name a few examples. In some embodiments, the insulator 5 has a substantially low defect density, to minimize shorts between the light collection layer 2 and collector 7. In addition the insulator 5 has one or more surfaces. In another configuration the electron return path 1 is above the insulator 5, as shown in FIG. 12B. This configuration permits the optically transparent support structure 3 to be uncovered, eliminating the need for the electrical return material 1 to be transparent. In this case, the top surface of the optically transparent support structure 3 does not have the conducting material 1 on the top surface as in FIG. 12A, rather the cathode conducting plane 1 sits over insulator 5. Having the cathode or electron return layer 1 over the insulator has an additional potential advantage in that electrical current is not conducted through the light collection layer (or collecting material) 2. In some cases, this reduces or eliminates potentially negative effects from electromagnetic fields generated by current flowing on the light collecting layer 2.

In some situations, waveguides and optical antennas provided herein are combinable with, or modifiable by, other structures, systems and/or methods, such as, for example, structures, systems and/or methods described in U.S. patent application Ser. No. 12/259,104, filed on Oct. 27, 2008; U.S. Pat. No. 3,994,012 to Warner, Jr. ("PHOTOVOLTAIC SEMICONDUCTOR DEVICES"); M. Laan, J. Aarik, R. Josepson and V. Repän, *Low current mode of negative coronas: mechanism of electron emission, J. Phys. D: Appl. Phys.*, 36, 2667-2672, 2003; V. Repän, M. Laan and T. Plank, *Electric Field Modeling for Point-Plane Gap, Institute of Experimental Physics and Technology*, University of Tartu, Tähe Estonia publication, 2002; P. Dombi and P. Rácz, *Ultrafast monoenergetic electron source by optical waveform control of surface plasmons, Optics Express*, Vol. 16, No. 5, pages 2887-2893, 3 Mar. 2008; and Mark I. Stockman, Matthias F. Kling, Ulf Kleineberg and Ferenc Krausz, *Attosecond nanoplasmonic-field microscope, Nature Photonics*, Vol. 1, pages 539-544, Sep. 3, 2007; Palash Bharadwaj et al., Advances in Optics and Photonics 1, 438-483 (2009); Peter Mühlschlegel, Ph. D. Thesis, University of Basel/Germany, February 2006; and Jong-Yeon Park et al., Japanese Journal of Applied Physics Vol. 43, No. 6A, 2004, pp. 3320-3327; Knight et al., "Photodetection with Active Optical Antennas," *Science* 332, 702 (2011); and Kotter et al., "Solar NANTENNA Electromagnetic Collectors", ASME Proceedings of the 2nd International Conference on Energy Sustainability, Aug. 10-14, 2008, Jacksonville, Fla., USA, which are entirely incorporated herein by reference.

Applications using visible light are broad and in some embodiments include any application requiring electrical energy where the system is exposed to light, such as, for example, buildings, cars, electronics, and the like. Applications are not limited to outdoor applications because the system may be positioned anywhere sufficient light is available. In some instances, the system is advantageously enhanced using light focusing techniques including mirrors or Fresnel lenses. In suitable instances, other applications include refueling aircraft using infrared or microwave energy, with conical sizes on the order of the intended wavelength of electromagnetic radiation. In some embodiments, for lower frequency applications, the intensity is increased to generate strong enough localized fields since the energy per photon is lower at lower frequencies.

It should be understood from the foregoing that, while particular implementations have been illustrated and described, various modifications may be made thereto and are contemplated herein. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A field-enhancing energy collection device, comprising:
   a substrate comprising a base surface, the base surface comprising a recessed structure having one or more angled wall surfaces that taper downward away from the base surface, between which one or more angled wall surfaces is formed a recess void, the recess void being empty or filled with a transparent or translucent material, the one or more angled wall surfaces coming in contact or close proximity to one another at a distance from the base surface, the one or more angled surfaces comprising an electromagnetic energy conducting waveguide optically exposed to the recess void, wherein the electromagnetic energy conducting waveguide is formed of a metallic material; and
   an electrode adjacent or in close proximity to the substrate, thereby forming a gap between the electrode and the electromagnetic energy conducting waveguide,
   wherein the gap comprises a photovoltaic material, and
   wherein the field-enhancing energy collection device comprises a field enhancement region separated from the electrode.

2. The field-enhancing energy collection device of claim 1, wherein a curvature of the recess void changes at said distance from the base surface.

3. The field-enhancing energy collection device of claim 1, wherein the gap between the electrode and the electromagnetic energy conducting waveguide comprises a vacuum void, a gas, a substrate or a combination thereof.

4. The field-enhancing energy collection device of claim 1, wherein the photovoltaic material comprises an electrolyte and $TiO_x$, wherein 'x' is a number greater than zero.

5. The field-enhancing energy collection device of claim 1, wherein the electrode includes an anode, and wherein the electromagnetic energy conducting waveguide includes a cathode.

6. The field-enhancing energy collection device of claim 5, wherein the substrate comprises an insulating or semiconducting material, and wherein the cathode includes one or more materials selected from the group consisting of Al, Ag, Au, Cu, Pt, Ni, Mn, Mg, Ru, Rh, and W.

7. The field-enhancing energy collection device of claim 1, wherein the base surface dimensions of said recessed structure is greater than 500 nanometers ("nm").

8. The field-enhancing energy collection device of claim 1, wherein the substrate is electrically insulated from the electromagnetic energy conducting waveguide.

9. The field-enhancing energy collection device of claim 1, wherein the recessed structure is in a conical, half dome, pyramidal, polygonal, linear track, or circular track configuration.

10. The field-enhancing energy collection device of claim 1, further comprising a transparent overcoat protection layer adjacent to the base surface.

11. The field-enhancing energy collection device of claim 1, wherein the electromagnetic energy conducting waveguide is situated on a surface of the recessed structure.

12. The field-enhancing energy collection device of claim 1, wherein the substrate comprises more than one recessed structure comprised in an array of recessed structures.

13. A field-enhancing energy collection device, comprising:
- a substrate comprising a base surface, the base surface comprising more than one recessed structure comprised in an array of recessed structures, each recessed structure having one or more angled wall surfaces that taper downward away from the base surface, between which one or more angled wall surfaces is formed a recess void, the recess void being empty or filled with a transparent or translucent material, the one or more angled wall surfaces coming in contact or close proximity to one another at a distance from the base surface, the one or more angled surfaces comprising an electromagnetic energy conducting waveguide optically exposed to the recess void, wherein the electromagnetic energy conducting waveguide is formed of a metallic material such that each recessed structure in the array of recessed structures includes a cathode that is spaced apart from an isolated anode; and
- an electrode comprising the isolated anode that is in close proximity to the substrate,
- wherein the field-enhancing energy collection device comprises a field enhancement region separated from the electrode.

14. The field-enhancing energy collection device of claim 13, wherein the array of recessed structures includes electromagnetic energy conducting waveguides that are in electrical communication with one another.

15. A field-enhancing energy collection device, comprising:
- a support structure comprising at least one recessed structure having a first end and a second end opposite from the first end, the recessed structure having one or more angled wall surfaces that taper downward away from the first end, the one or more angled wall surfaces defining a recess void, the recess void being empty or filled with an optically transparent or translucent material, the one or more angled wall surfaces coming into contact with or close proximity to one another at or near the second end, the one or more angled surfaces comprising an electromagnetic energy conducting waveguide optically exposed to the recess void, wherein the electromagnetic energy conducting waveguide is formed of a metallic material, and wherein the support structure is formed of an optically transparent material; and
- an electrode adjacent to the support structure, the electrode configured to collect electrons generated upon the application of electromagnetic radiation to the at least one recessed structure, the electrode spaced apart from the electromagnetic energy conducting waveguide,
- wherein field-enhancing energy collection device comprises a field enhancement structure adjacent to the electrode.

16. The field-enhancing energy collection device of claim 15, wherein the second end comprises a field enhancement region.

17. The field-enhancing energy collection device of claim 1, wherein the material of the electromagnetic energy conducting waveguide does not include a semiconductor.

18. The field-enhancing energy collection device of claim 15, wherein the material of the electromagnetic energy conducting waveguide does not include a semiconductor.

19. The field-enhancing energy collection device of claim 13, wherein the device comprises a gap between the isolated anode and the cathodes of the array of recessed structures.

20. The field-enhancing energy collection device of claim 19, wherein the gap comprises a photovoltaic material.

21. The field-enhancing energy collection device of claim 13, wherein the substrate comprises an insulating or semiconducting material, and wherein the cathodes include one or more materials selected from the group consisting of Al, Ag, Au, Cu, Pt, Ni, Mn, Mg, Ru, Rh, and W.

22. The field-enhancing energy collection device of claim 13, wherein base surface dimensions of each of said recessed structure is greater than 500 nanometers ("nm").

23. The field-enhancing energy collection device of claim 15, wherein the device comprises a gap between the electrode and the electromagnetic energy conducting waveguide, and wherein the gap comprises a vacuum void, a gas, a substrate or a combination thereof.

24. The field-enhancing energy collection device of claim 15, wherein the electrode comprises an anode, and wherein the electromagnetic energy conducting waveguide comprises a cathode.

25. The field-enhancing energy collection device of claim 24, wherein the support structure comprises an insulating or semiconducting material, and wherein the cathode includes one or more materials selected from the group consisting of Al, Ag, Au, Cu, Pt, Ni, Mn, Mg, Ru, Rh, and W.

26. The field-enhancing energy collection device of claim 15, wherein a dimension of said recessed structure at the first end is greater than 500 nanometers ("nm").

* * * * *